US011437917B2

(12) United States Patent
Yu et al.

(10) Patent No.: US 11,437,917 B2
(45) Date of Patent: Sep. 6, 2022

(54) PREDICTIVE SYNCHRONOUS RECTIFIER SENSING AND CONTROL

(71) Applicant: TEXAS INSTRUMENTS INCORPORATED, Dallas, TX (US)

(72) Inventors: Sheng-Yang Yu, Plano, TX (US); Manish Bhardwaj, Sugar Land, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 104 days.

(21) Appl. No.: 16/938,757

(22) Filed: Jul. 24, 2020

(65) Prior Publication Data

US 2021/0028712 A1 Jan. 28, 2021

Related U.S. Application Data

(60) Provisional application No. 62/878,569, filed on Jul. 25, 2019.

(51) Int. Cl.
| | |
|---|---|
| *H02M 3/335* | (2006.01) |
| *H01F 30/16* | (2006.01) |
| *G01R 15/18* | (2006.01) |
| *H01F 38/38* | (2006.01) |

(52) U.S. Cl.
CPC ........ *H02M 3/33592* (2013.01); *H01F 30/16* (2013.01); *H01F 38/38* (2013.01); *G01R 15/183* (2013.01); *H02M 3/335* (2013.01); *H02M 3/33507* (2013.01); *H02M 3/33523* (2013.01)

(58) Field of Classification Search
CPC ............. H02M 3/335; H02M 3/33507; H02M 3/33523; H01F 30/16; G01R 15/183
See application file for complete search history.

(56) References Cited

U.S. PATENT DOCUMENTS

| | | | | | |
|---|---|---|---|---|---|
| 4,370,607 | A | * | 1/1983 | Dassonville | H02M 1/088 313/324 |
| 5,519,560 | A | * | 5/1996 | Innes | G01R 15/183 361/87 |
| 9,188,610 | B1 | * | 11/2015 | Edel | G01R 15/183 |
| 2010/0013460 | A1 | * | 1/2010 | Ermisch | G01R 15/181 324/127 |
| 2012/0218793 | A1 | * | 8/2012 | Springett | H02M 3/33592 363/89 |
| 2012/0319473 | A1 | * | 12/2012 | Tzivanopoulos | G01R 15/20 307/10.1 |

(Continued)

OTHER PUBLICATIONS

B. Yang, F. C. Lee, A. J. Zhang, and G. Huang, "LLC resonant converter for front end DC/DC conversion," in Proc. APEC, Aug. 2002, pp. 1108-1112, 5 pages.

(Continued)

*Primary Examiner* — Gary A Nash
(74) *Attorney, Agent, or Firm* — Michael A. Davis. , Jr.; Charles A. Brill; Frank D. Cimino

(57) ABSTRACT

For predictive synchronous rectifier sensing and control, an example apparatus includes an air core toroid having a voltage output, the air core toroid adapted to surround a portion of a current path and adapted to be coupled through the current path to a transformer, and a control logic circuit having a voltage input and a control output, the voltage input coupled to the voltage output, and the control output adapted to be coupled to a switch.

18 Claims, 20 Drawing Sheets

(56) References Cited

U.S. PATENT DOCUMENTS

| | | | | |
|---|---|---|---|---|
| 2013/0257412 A1* | 10/2013 | Wynne | ............... | G01R 15/181 |
| | | | | 324/127 |
| 2014/0160820 A1* | 6/2014 | McKinley | ............ | G01R 15/186 |
| | | | | 363/126 |
| 2014/0354439 A1* | 12/2014 | Nguyen | ............... | G01R 15/183 |
| | | | | 340/660 |
| 2015/0180357 A1* | 6/2015 | Syvaranta | ......... | H02M 3/33592 |
| | | | | 363/17 |
| 2016/0284459 A1* | 9/2016 | Ishigaki | ................ | H01F 30/16 |
| 2016/0320434 A1* | 11/2016 | Pascal | ................. | G01R 35/005 |
| 2017/0154726 A1* | 6/2017 | Prager | .................... | H01F 30/16 |

OTHER PUBLICATIONS

B. Zhao, Q. Song, W. Liu, and Y. Sun, "Overview of Dual-Active-Bridge Isolated Bidirectional DC-DC Converter for High-Frequency-Link Power-Conversion System," IEEE Transactions on Power Electronics, vol. 29, Nov. 2014, pp. 4091-4106, 16 pages.

J. Wang and B. Lu, "Open loop synchronous rectifier driver for LLC resonant converter," in 2013 Twenty-Eighth Annual IEEE Applied Power Electronics Conference and Exposition (APEC), May 2013, pp. 2048-2051, 4 pages.

Texas Instruments, "UCC24610 Green Rectifier Controller Device" [Online]. Available: http://www.ti.com/lit/ds/symlink/ucc24610.pdf, August 2010—revised Oct. 2015, 43 pages.

M. H. Samimi, A. Mahari, M. A. Farahnakian, and H. Mohseni, "The Rogowski Coil Principles and Applications: A Review," IEEE Sensors Journal, vol. 15, Feb. 2015, pp. 651-658, 8 pages.

* cited by examiner

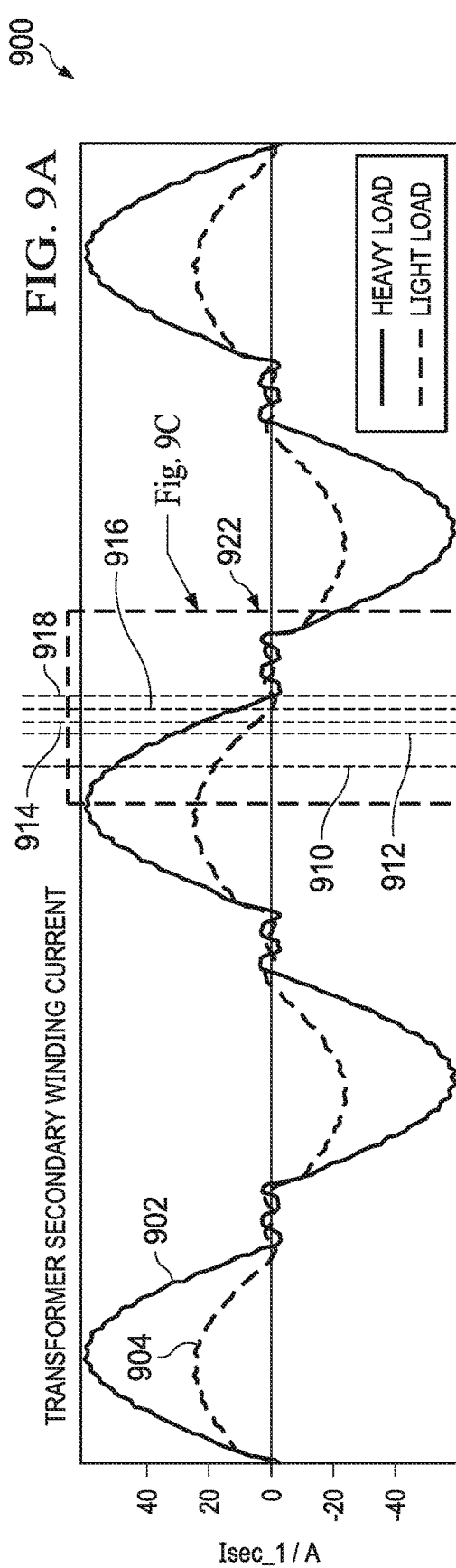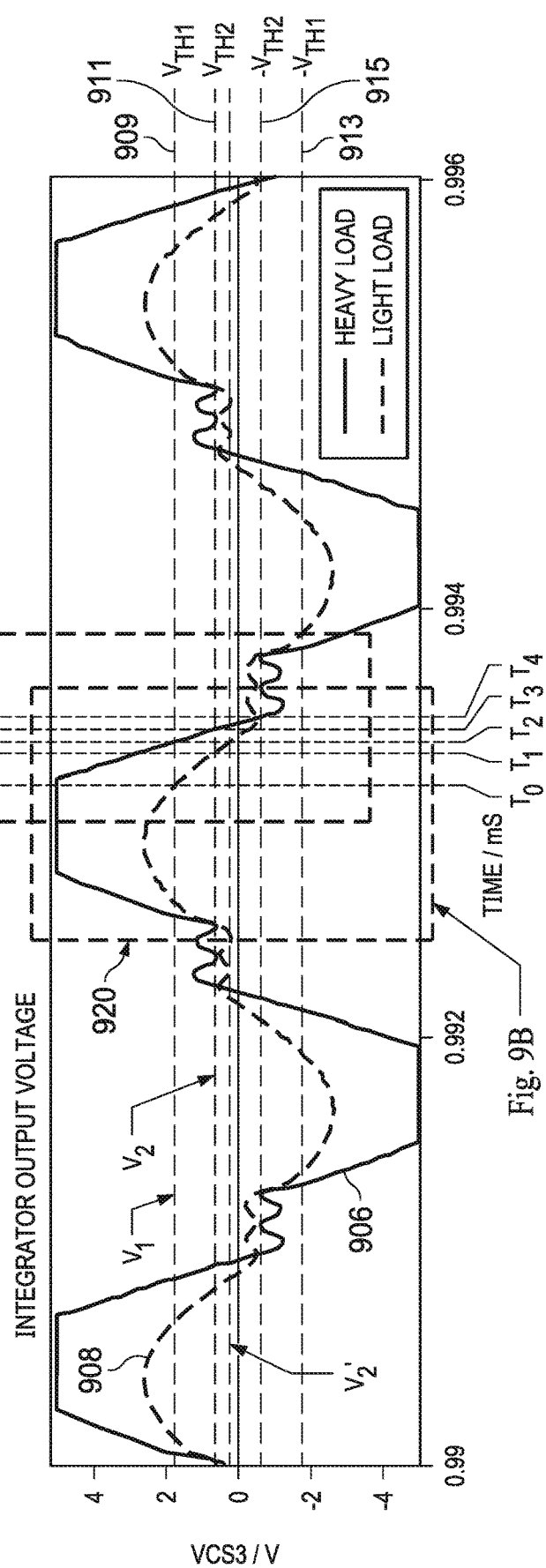

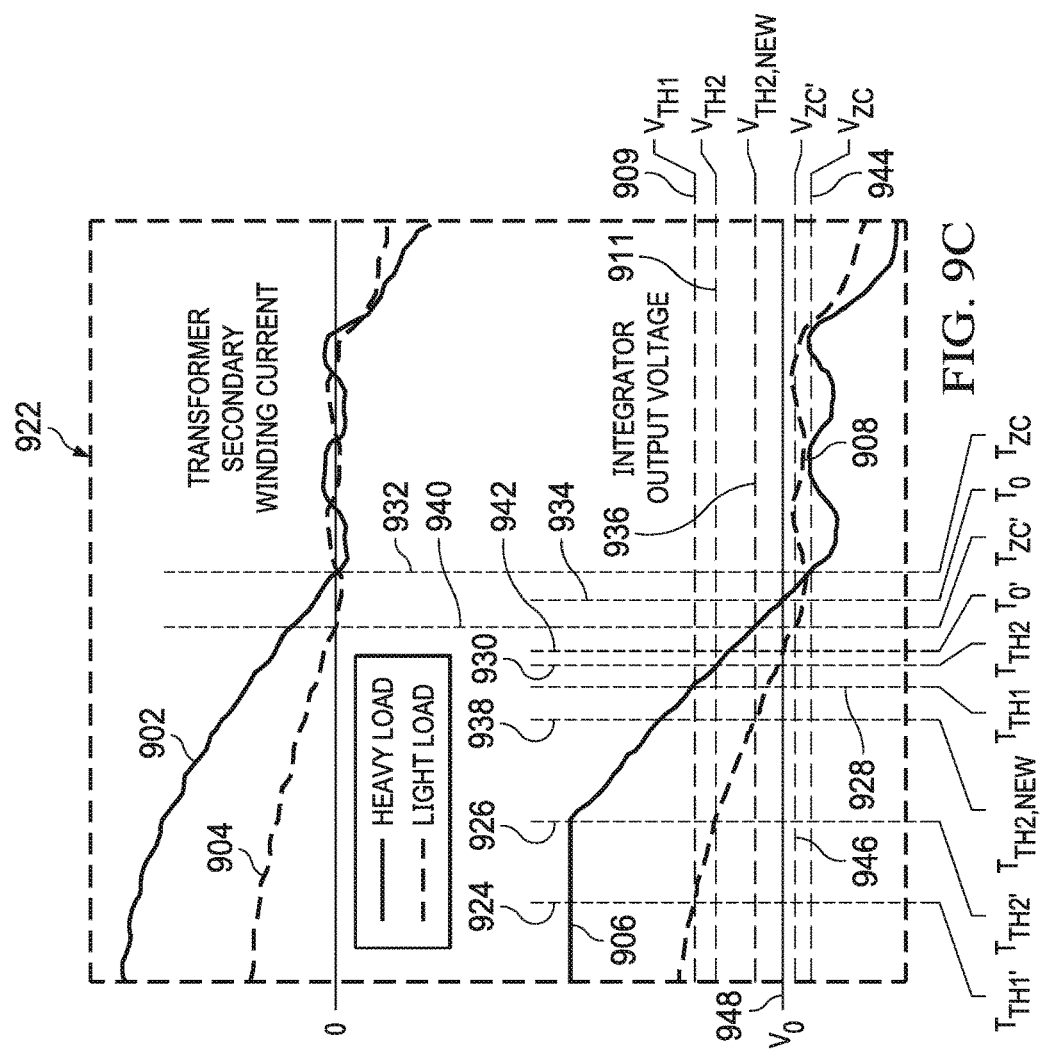
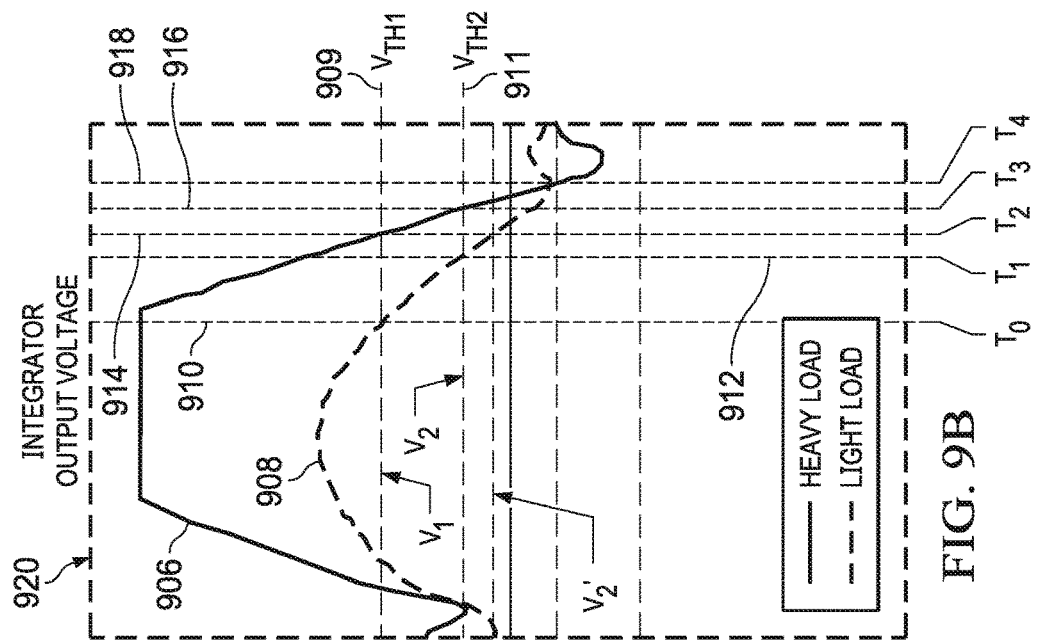
FIG. 9C
FIG. 9B

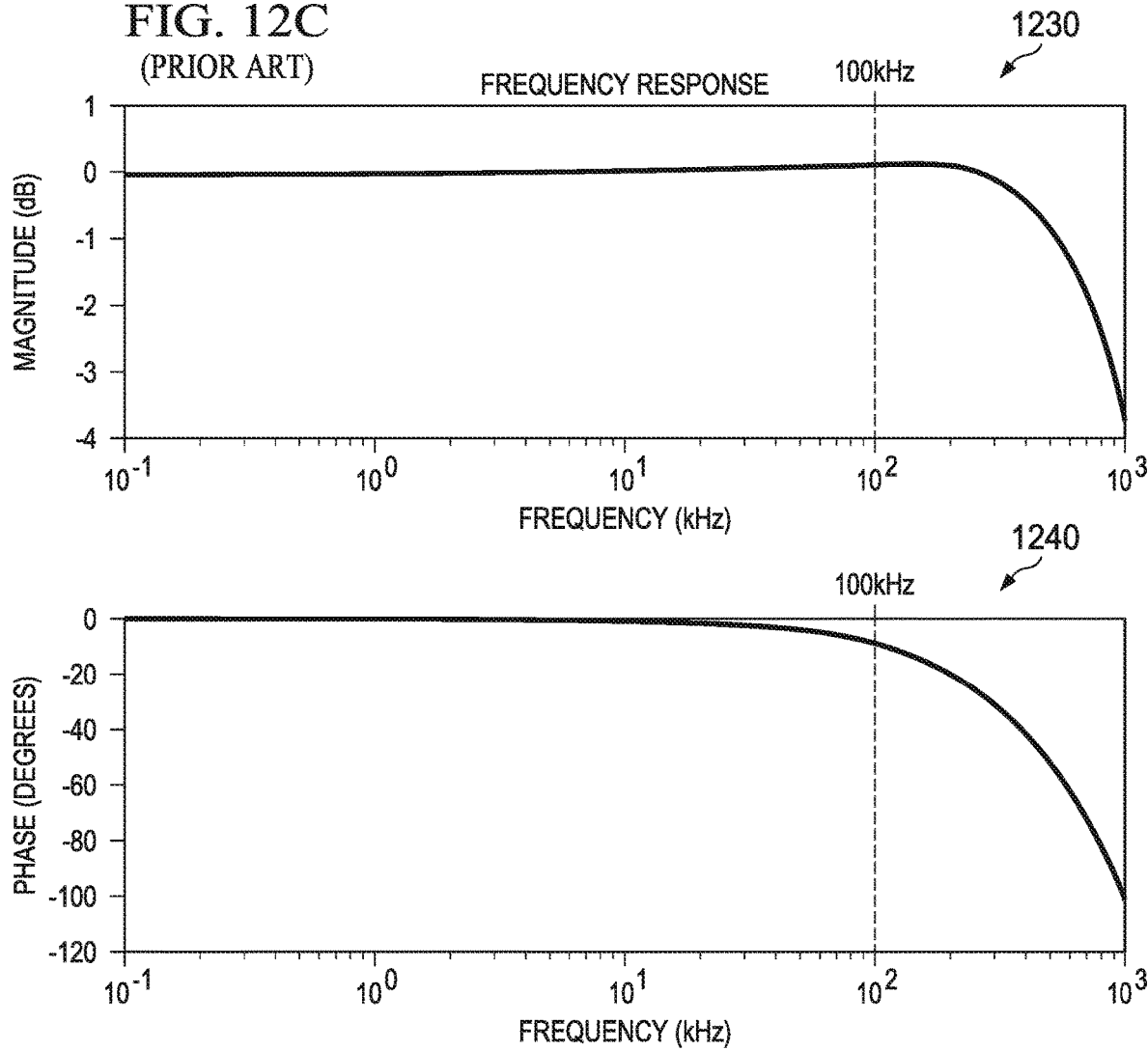

PREDICTIVE SYNCHRONOUS RECTIFIER SENSING AND CONTROL

CROSS-REFERENCE TO RELATED APPLICATION

This patent application claims the benefit of and priority to U.S. Provisional Patent Application Ser. No. 62/878,569 filed Jul. 25, 2019, which is hereby incorporated herein by reference in its entirety.

TECHNICAL FIELD

This description relates generally to circuits, and more particularly to predictive synchronous rectifier sensing and control.

BACKGROUND

Resonant converters have been increasingly used in high-voltage power conversion applications due to their relatively high efficiency compared to other types of power converters. Such applications may benefit from resonant converters having the ability to provide a wide range of soft switching on circuit switches, such as field-effect transistor (FET) switches.

SUMMARY

For predictive synchronous rectifier sensing and control, an example apparatus includes an air core toroid, the air core toroid to surround a current path associated with a transformer having a first winding and a second winding, the current path in circuit with an output terminal coupled to the second winding, and a control logic circuit coupled to the air core toroid.

BRIEF DESCRIPTION OF THE DRAWINGS

FIG. 9A is an example timing diagram associated with the example power converter of FIGS. 2 and/or 3.

FIG. 9B is an enlarged portion of the example timing diagram of FIG. 9A.

FIG. 9C is another enlarged portion of the example timing diagram of FIG. 9A.

FIG. 12C depicts example waveforms associated with the example power conversion system of FIG. 12A.

DETAILED DESCRIPTION

Figure 1:
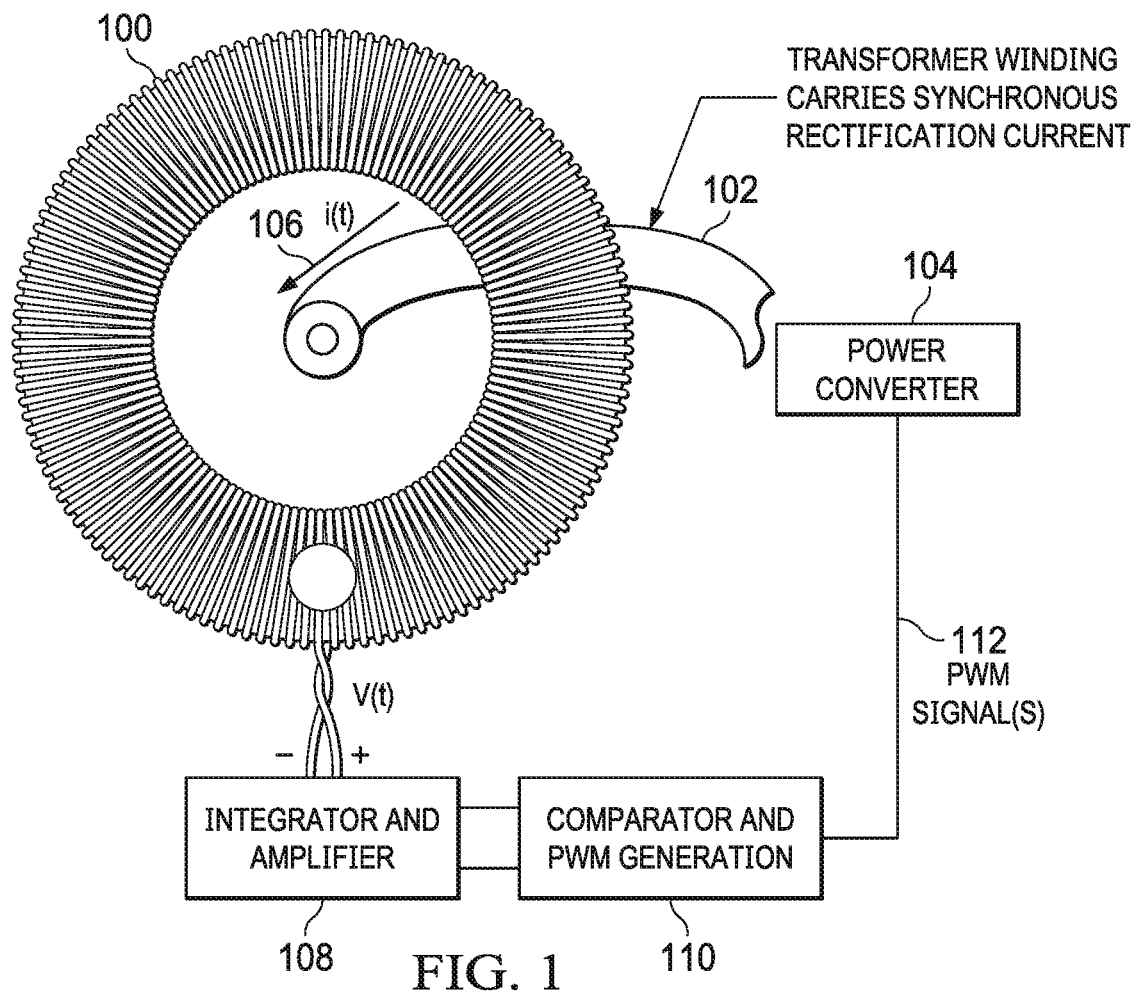
FIG. 1 depicts an example Rogowski coil arranged around an example current path of an example power converter.

The drawings are not to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Power converters, such as resonant converters, may be used in various applications like server, telecom, and consumer electronics, as well as in high-voltage power conversion applications, such as in charging systems for electric vehicles (EVs), hybrid-electric vehicles (HEVs), etc. A resonant converter is a type of electric power converter that typically includes a switch network, a resonant network (e.g., a resonant tank), and a rectifier network. The switch network includes one or more switches (e.g., transistors) to generate pulsating voltage or current from a direct current (DC) voltage or current source and feed it into the resonant tank. The rectifier network receives the pulsating voltage or current from the resonant tank and rectifies the pulsating signal into a DC voltage or current. The resonant tank modulates its gain amplitude by changing the pulsating signal frequency.

A resonant converter may be controlled using synchronous rectifier (SR) sensing and control. In a power supply, such as an isolated switch mode power supply, SR sensing and control becomes challenging when a switching frequency of the power converter is relatively high (e.g., greater than 300 kilohertz (kHz)). Conventional SR sensing and control techniques, such as using a current sense resistor, a current transformer, or drain-to-source voltage (VDS) sensing faces challenges of limited bandwidth or relatively high response time and propagation delay in high-switching frequency applications. SR conduction in high-frequency power converters may not be optimized with such conventional SR sensing and control techniques and, thus, an efficiency of the high-frequency power converters may be reduced. Moreover, in high-frequency applications, the delay caused by the controller to react to the sensed SR signal may lead to efficiency loss and sub-optimal power converter performance.

SR sensing and control using a current sensing resistor involves actual SR current to flow through the current sensing resistor to determine whether to turn on or off SR. Power loss on the current sensing resistor reduces power converter efficiency because the SR current flows through the current sensing resistor. In some instances, an amplifier is added in connection with the current sensing resistor to amplify a current sensing signal and reduce the loss on the current sensing resistor. However, the amplifier introduces additional response time and propagation delay. Additionally, in many instances when a controller for the power converter is on a primary side of the power converter, the current sensing signal cannot directly be connected to the controller, and the delay caused by isolated amplifiers may be unacceptable for the high-frequency systems.

SR sensing and control using a current transformer introduces additional inductance from a winding of the current transformer. The inductance results in higher voltage stress during switching transient and higher loss on the SR. In some instances, current transformers use ferrite core material having a bandwidth in range of approximately 300 kHz-500 kHz. In such instances, the sensed current waveform may not represent (e.g., accurately represent) the SR current when the switching frequency is approximate to or above the current transformer bandwidth.

SR sensing and control using VDS sensing is relies on precise voltage sensing (e.g., voltage sensing with millivolt (mV) precision). In some instances, VDS sensing may be implemented with an integrated circuit (IC). In such instances, VDS sensing may be accurately used with peak voltages up to 200 volts (V). VDS sensing accuracy is reduced at higher voltages, such as voltages higher than 200V. Further, VDS sensing accuracy is reduced at higher switching frequencies, such as switching frequencies greater than 400 kHz.

Examples described herein include methods and apparatus for predictive synchronous rectifier sensing and control with a Rogowski coil. Such described examples effectuate high voltage and/or high frequency (e.g., high-switching frequency) SR sensing and control. In some described examples, a Rogowski coil, or a coil having windings on a toroid coil (e.g., an air core), is disposed, placed, and/or otherwise arranged around a SR current loop of a power converter. In such described examples, the current (e.g., the SR current) flowing through the SR current loop is a time-varying current that generates magnetic flux that couples to the Rogowski coil. In some such described examples, the Rogowski coil generates a voltage signal having a phase that is different (e.g., a 90 degree phase difference) from the SR current.

In some described examples, the voltage signal is used by example SR control logic as a SR current sensing signal. In such described examples, the SR control logic includes integrator logic (e.g., active integrator logic, passive integrator logic, etc.) coupled to an output of the Rogowski coil to adjust the phase of the SR current sensing signal to effectuate optimal and/or otherwise improved SR conduction. In some such described examples, the SR control logic includes gain amplifier logic to amplify the output from the integrator logic to generate an amplified SR current sensing signal.

In some described examples, the SR control logic controls one or more switches (e.g., transistors) in response to the SR current sensing signal satisfying a threshold (e.g., a zero-crossing threshold), which may be representative of the SR current crossing and/or otherwise meeting a zero-current threshold. For example, the SR control logic can generate pulse-width modulation (PWM) signal(s) to control (e.g., configured to control) the one or more switches to control (e.g., configured to control) SR.

In some described examples, the SR control logic includes slope detection logic to adjust the threshold based on a load associated with the resonant converter. For example, the slope detection logic can determine a first counter value corresponding to a first time or timestamp at which the SR current sensing signal satisfies a first threshold (e.g., $V_{TH1}$) and a second counter value corresponding to a second time or timestamp at which the SR current sensing signal satisfies a second threshold (e.g., $V_{TH2}$). In such examples, the slope detection logic can determine a slope based on a ratio of a first difference (e.g., a voltage difference) between the first threshold and the second threshold and a second difference (e.g., a counter value difference, a time difference, a timestamp difference, etc.) between the first counter value and the second counter value. In some such examples, the slope detection logic can determine that the load is representative of a relatively high load in response to determining a relatively high or steep slope and determine that the load is representative of a relatively low load in response to determining a relatively low or gradual slope. In such described examples, the slope detection logic can increase the zero-crossing threshold responsive to the steep slope, decrease the zero-crossing threshold responsive to the gentle slope. Advantageously, the example SR control logic can predict and/or otherwise determine that a zero-crossing event (e.g., SR current changing from positive to negative or negative to positive) is to occur prior to the zero-crossing event occurring based on a determination of a slope of the SR current.

FIG. 1 depicts an example Rogowski coil 100 arranged around an example current path 102 of an example power converter 104. In this example, the Rogowski coil 100 surrounds the current path 102, where the current path 102 travels through an inner portion of the Rogowski coil 100. For example, the Rogowski coil 100 can surround the current path 102 by encircling, enclosing, encompassing, etc., the current path 102. In the illustrated example of FIG. 1, the Rogowski coil 100 is an air core toroid. For example, the Rogowski coil 100 has windings on a toroid coil (e.g., an air-core toroidal coil, a toroid coil having an air core, etc.). For example, the Rogowski coil 100 includes a helical coil of wire having a lead from one end that returns through a center of the Rogowski coil 100 to the other end, so that both terminals are at the same end of the Rogowski coil 100, with an inner portion of the Rogowski coil being air filled.

The current path 102 may be implemented by a wire or cable including a conductor configured to deliver or provide example electrical current (i(t)) 106 from the power converter 104. For example, the current path 102 is representative of a transformer winding (e.g., a winding of a transformer associated with the power converter 104) carrying SR current associated with a current loop (e.g., an SR current loop). The Rogowski coil 100 is disposed, placed, and/or otherwise arranged around the current path 102 so that the current 106 flowing along the current path 102 travels through the core (e.g., the center, the center section or portion, etc.) of the Rogowski coil 100. For example, the Rogowski coil 100 surrounds (e.g., encloses, encircles, encompasses, includes, etc.) the current path 102. The current 106 is a time-varying current that generates magnetic flux that couples to the Rogowski coil 100. Responsive to the current 106, the Rogowski coil 100 generates a voltage (V(t)) having a phase different from the current 106. For example, the voltage can have a 90 degree phase difference from the current 106. The voltage can be representative of an SR current sensing signal.

The power converter 104 is a converter with a power transformer (e.g., a high-frequency power converter). For example, the power converter 104 can be a resonant converter, such as a capacitor-inductor-inductor-inductor-capacitor (CLLLC) series resonant (SRes) dual active bridge (DAB) converter. Alternatively, the power converter 104 may be any other type of power converter, such as an inductor-inductor-capacitor (LLC) SRes converter, a phase-shift full bridge converter, etc.

Output terminals of the Rogowski coil 100 are coupled to input terminals of example integrator and amplifier logic 108. The integrator and amplifier logic 108 can include integrator logic (e.g., one or more integrators, an integrator circuit, etc.), which can be active or passive. The integrator logic can be arranged at the output of the Rogowski coil 100 to align the phases of V(t) and the current 106 to generate an integrated V(t) signal to improve SR conduction. The integrator and amplifier logic 108 can include amplifier logic (e.g., one or more amplifiers, an amplifier circuit, etc.) to amplify the integrated V(t) signal.

Output terminals of the integrator and amplifier logic 108 are coupled to input terminals of example comparator and PWM generation logic 110. The comparator and PWM generation logic 110 includes comparator logic (e.g., one or more comparators, a comparator circuit, etc.) to compare the amplified integrated V(t) signal to one or more thresholds, such as a zero-crossing threshold. In some examples, the comparator and PWM generation logic 110 determines a change in the current 106 with respect to time (e.g., a slope, a current slope, etc.) and adjusts the one or more thresholds based on the change in the current 106 with respect to time. The comparator and PWM generation logic 110 includes PWM logic (e.g., a PWM circuit) that, when responsive to the amplified integrated V(t) signal satisfying the one or more thresholds, can generate example PWM signal(s) 112 to control one or more switches included in the power converter 104.

Advantageously, SR control of the power converter 104 with the Rogowski coil 100 can be effectuated at higher bandwidths compared to conventional SR control techniques due to the air core of the Rogowski coil 100. Advantageously, the integrator and amplifier logic 108 can be configured to cancel and/or otherwise reduce the response time and propagation delay based on determining a phase difference between the current 106 and V(t). Advantageously, the use of the Rogowski coil 100 effectuates lossless SR sensing unlike conventional SR sensing and control techniques that include a current sensing resistor or a current transformer.

Figure 2:
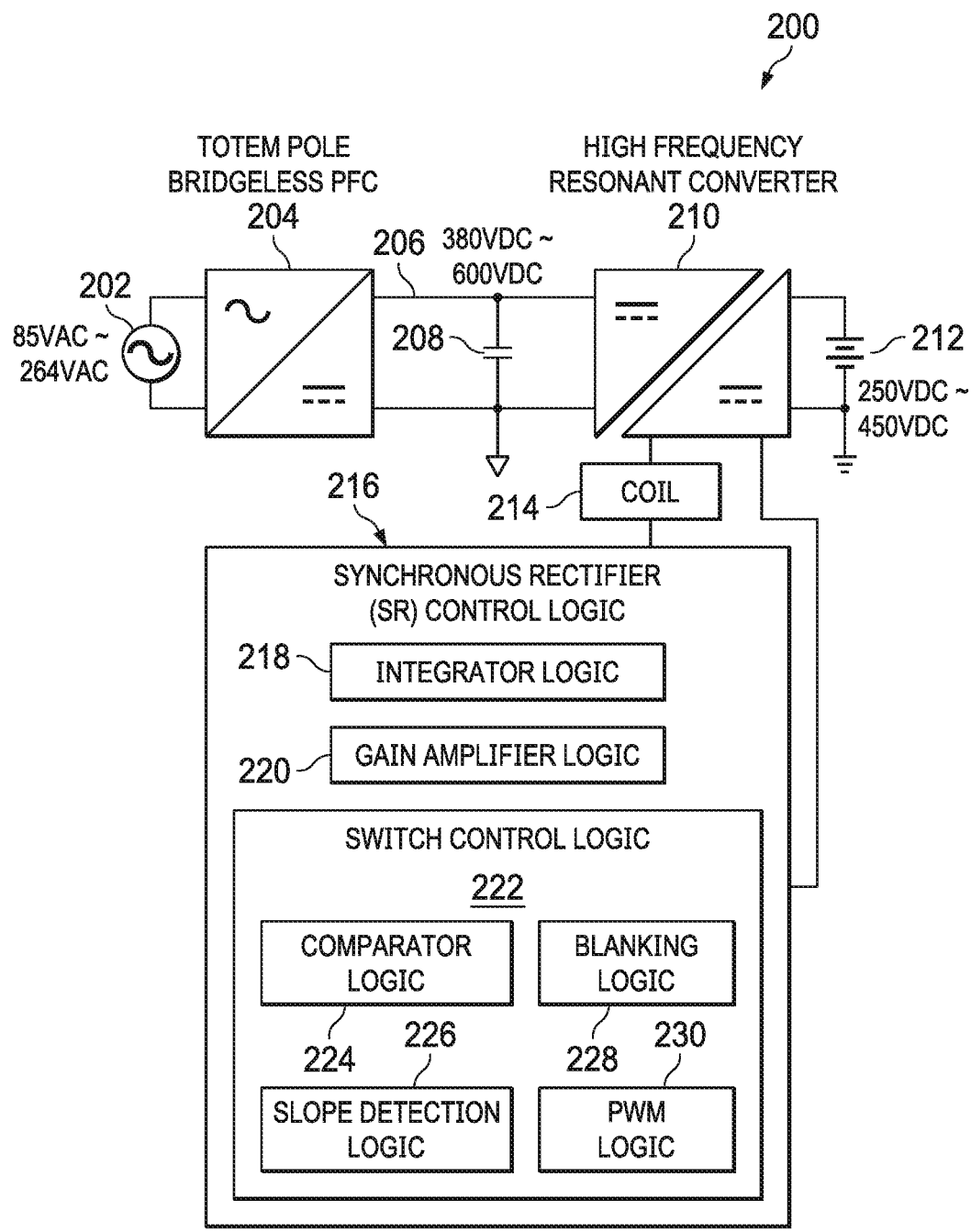
FIG. 2 is a schematic illustration of an example power conversion system including an example power converter, an example coil, and example synchronous rectifier (SR) control logic.

FIG. 2 is a schematic illustration of an example power conversion system 200 including an example power source 202, an example power factor correction (PFC) circuit 204, an example power bus 206, an example capacitor 208, an example power converter 210, an example load 212, an example coil 214, and example synchronous rectifier (SR) control logic 216. The power source 202 is an alternating current (AC) source. For example, the power source 202 can be an AC source configured to deliver an AC voltage in a range of 85 VAC to 264 VAC. In such examples, the power source 202 can be representative of a power grid (e.g., a wall outlet), an alternator in a vehicle (e.g., an EV, an HEV, etc.), etc. Alternatively, any other AC voltage and/or range of AC voltage may be generated by the power source 202.

An output terminal of the power source 202 is coupled to an input terminal of the PFC circuit 204. The PFC circuit 204 is a totem pole bridgeless PFC circuit configured to convert an AC voltage from the power source 202 to a DC voltage source and to reduce harmonics thereof. An output terminal of the PFC circuit 204 is coupled to the bus 206. The bus 206 is a variable bus having a voltage in a range of 380 VDC to 600 VDC. Alternatively, the bus 206 may be any other DC voltage and/or range of DC voltages. The bus 206 includes the capacitor 208, which has a terminal coupled to the output terminal of the PFC circuit 204 and to an input terminal of the power converter 210.

The power converter 210 is a high-frequency resonant converter. For example, the power converter 210 can be a CLLLC SRes DAB converter. Alternatively, the power converter 210 may be any other type of power converter with power transformer, such as an LLC SRes converter, a phase-shift full bridge converter, etc. For example, the power converter 210 can implement the power converter 104 of FIG. 1. The power converter 210 converts a first DC voltage from the bus 206 to a second DC voltage, which is delivered to the load 212. For example, the first DC voltage may be in a range of 380 VDC to 600 VDC and the second DC voltage may be in a range of 250 VDC to 450 VDC. The load 212 can be a battery (e.g., a lithium-ion battery). For example, the load 212 can be a battery in a EV, an HEV, etc. Alternatively, the load 212 may be any other type of load, such as a power supply in a server (e.g., a computer server), telecommunications equipment or devices, or any other type of computing and/or electronic device.

The coil 214 is arranged around a current path of the power converter 210. In this example, the coil 214 surrounds (e.g., encircles, encloses, encompasses, includes, etc.) the current path of the power converter 210, where the current path is to travel through an inner portion of the coil 214. In this example, the coil 214 is an air core toroid, such as a Rogowski coil. For example, the coil 214 can implement the Rogowski coil 100 of FIG. 1. Current flowing through the current path is a time-varying current that invokes and/or otherwise causes the coil 214 to generate a voltage (e.g., a time-varying voltage) that can be used by the SR control logic 216 to control (e.g., configured to control) one or more switches (e.g., transistors) of the power converter 210 to effectuate SR control of the power converter 210.

An example implementation of the SR control logic 216 is a logic circuit (e.g., a control logic circuit, an SR control logic circuit, etc.) or logic circuitry (e.g., control logic circuitry, SR control logic circuitry, etc.). The SR control logic 216 includes example integrator logic 218, example gain amplifier logic 220, example switch control logic 222, example comparator logic 224, example slope detection logic 226, example blanking logic 228, and example PWM logic 230. The SR control logic 216 includes the integrator logic 218 to receive the time-varying voltage from the coil 214 and generate a voltage (e.g., an integrated voltage) that is in phase (e.g., approximately in phase, in phase within a range of −3 to 3 degrees, etc.) or, in some examples, leading the time-varying current of the current path. For example, the integrator logic 218 can be configured to generate and/or otherwise effectuate a desired or intended phase difference to compensate for propagation and control delay associated with the SR control logic 216.

The SR control logic 216 includes the gain amplifier logic 220 to amplify an output from the integrator logic 218. For example, the gain amplifier logic 220 can amplify the integrated voltage to generate an increased and/or otherwise amplified voltage (e.g., an amplified integrated voltage, an amplified integrated output voltage, etc.). In such examples, the gain amplifier logic 220 can increase the integrated voltage from a first voltage to a second voltage greater than the first voltage.

The SR control logic 216 includes the switch control logic 222 to compare an output from the gain amplifier logic 220 to one or more thresholds and generate one or more control signals to control respective one(s) of switches included in the power converter 210 based on the comparison(s). An example implementation of the switch control logic 222 can be a logic circuit (e.g., a switch control logic circuit) or logic circuitry (e.g., switch control logic circuitry). The switch control logic 222 includes the comparator logic 224, the slope detection logic 226, the blanking logic 228, and the PWM logic 230.

The switch control logic 222 includes the comparator logic 224 to compare a voltage (e.g., an amplified integrated voltage), which corresponds to the time-varying current generated by the coil 214, to a threshold. For example, the threshold can be a zero-crossing threshold or a zero-voltage threshold. In such examples, the threshold can be a voltage based on approximately zero current or, in some examples, zero current. Responsive to the amplified integrated voltage satisfying and/or otherwise meeting the threshold, the comparator logic 224 can determine that the integrated voltage transitions from a positive voltage to a negative voltage or a negative voltage to a positive voltage, either of which can be a zero-crossing event. In some examples, the amplified integrated voltage satisfying the threshold occurs prior to the time-varying current crossing a zero-current threshold (e.g., a zero-current crossing, a time-varying current zero-current crossing, etc.).

The switch control logic 222 includes the slope detection logic 226 to adjust a threshold, such as the zero-crossing threshold, based on a load condition associated with the load 212. The slope detection logic 226 can determine a load condition (e.g., a heavy load condition, a light or low load condition, etc.) of the load 212 by determining a slope of the amplified integrated voltage. The slope detection logic 226 can determine the slope based on a ratio of (i) a first difference between a first amplified integrated voltage value at a first time and a second amplified integrated voltage value at a second time and (ii) a second difference between a first counter value corresponding to the first time and a second counter value corresponding to the second time.

In some examples, responsive to a relatively high or steep slope, the slope detection logic 226 can determine the load condition of the load 212 is a heavy load condition. In such examples, responsive to the determination of the heavy load condition, the slope detection logic 226 can adjust the threshold to be a first threshold (e.g., a first zero-crossing threshold). In some examples, responsive to a relatively low or gradual slope, the slope detection logic 226 can determine the load condition of the load 212 is a light load condition. In such examples, responsive to the determination of the light load condition, the slope detection logic 226 can adjust the threshold to be a second threshold (e.g., a second zero-crossing threshold). Alternatively, the slope detection logic 226 may select from a different number of thresholds (e.g., three thresholds, ten thresholds, etc.) based on a different number of load conditions (e.g., a heavy, medium, or light load condition, a first through tenth load condition, etc.).

The switch control logic 222 includes the blanking logic 228 to generate a blanking window or filter to avoid and/or otherwise prevent a false trigger responsive to noise (e.g., electrical noise, turn-on noise, switch turn on-noise, etc.). For example, the PWM logic 230, and/or, more generally, the SR control logic 216, may not control one(s) of the switch(es) of the power converter 210 during the blanking window generated by the blanking logic 228.

In this example, the PWM logic 230 is a logic circuit (e.g., a PWM logic circuit) or logic circuitry (e.g., PWM logic circuitry). In some examples, the PWM logic 230 is hardware. For example, the PWM logic 230 can be a hardware-implemented state machine, a controller (e.g., an analog controller, a digital controller, etc.), etc., configured to generate a control signal, such as a PWM signal. The switch control logic 222 includes the PWM logic 230 to generate control signal(s) (e.g., PWM signal(s)) to control one(s) of the switches responsive to detection of a zero-crossing event. For example, the PWM logic 230 can generate a first control signal to turn off a first switch of the power converter 210 to end a low-side switching cycle of the power converter 210. In such examples, the PWM logic 230 can generate a second control to turn on a second switch of the power converter 210 to begin a high-side switching cycle of the power converter 210.

While an example manner of implementing the SR control logic 216 is illustrated in FIG. 2, one or more of the elements, processes and/or devices illustrated in FIG. 2 may be combined, divided, rearranged, omitted, eliminated and/or implemented in any other way. Further, the integrator logic 218, the gain amplifier logic 220, the switch control logic 222, the comparator logic 224, the slope detection logic 226, the blanking logic 228, the PWM logic 230, and/or, more generally, the SR control logic 216 of FIG. 2 may be implemented by hardware, software, firmware and/or any combination of hardware, software and/or firmware. Thus, for example, any of the integrator logic 218, the gain amplifier logic 220, the switch control logic 222, the comparator logic 224, the slope detection logic 226, the blanking logic 228, the PWM logic 230, and/or, more generally, the SR control logic 216 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the integrator logic 218, the gain amplifier logic 220, the switch control logic 222, the comparator logic 224, the slope detection logic 226, the blanking logic 228, and/or the PWM logic 230 is/are hereby expressly defined to include a non-transitory computer readable storage device or storage disk such as a memory (e.g., a non-volatile memory, a volatile memory, etc.), a digital versatile disk (DVD), a compact disk (CD), a Blu-ray disk, etc., including the software and/or firmware. Further still, the SR control logic 216 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
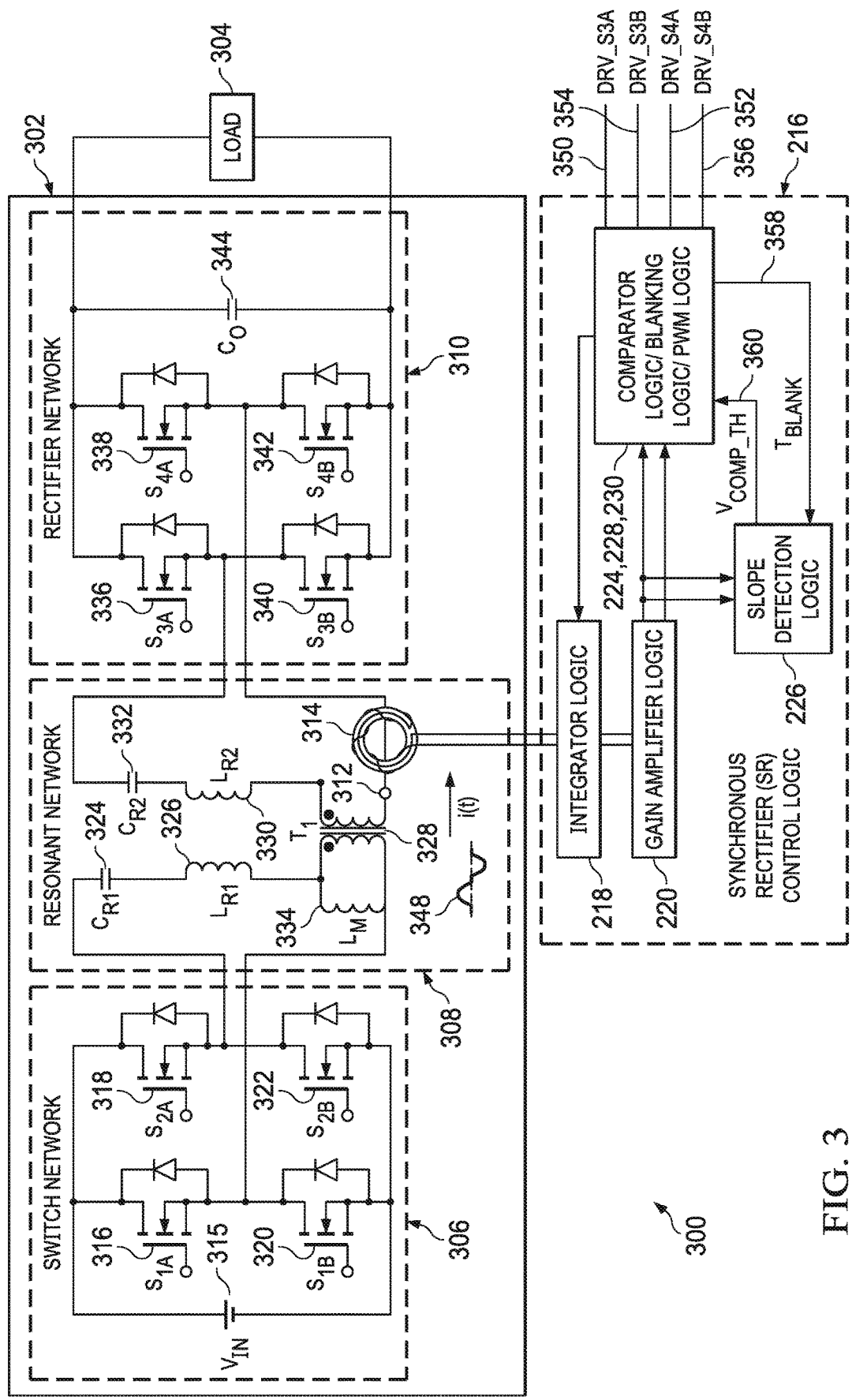
FIG. 3 is a schematic illustration of an example implementation of the power converter and the SR control logic of FIG. 2.

FIG. 3 is a schematic illustration of an example power conversion system 300 including an example power converter 302 and an example load 304. The power conversion system 300 of FIG. 3 may implement the power conversion system 200 of FIG. 2. The power converter 302 of FIG. 3 may implement the power converter 210 of FIG. 2. The load 304 of FIG. 3 may implement the load 212 of FIG. 2.

The power converter 302 is a CLLLC bi-directional resonant converter. Alternatively, the power converter 302 may be any other type of power converter with a power transformer, such as a phase-shift full bridge converter. The power converter 302 includes an example switch network 306, a first example network (e.g., a resonant network) 308, and a second example network (e.g., a rectifier network) 310. The power conversion system 300 includes an example Rogowski coil 314 arranged around a current path of, and/or otherwise associated with, the first network 308. In this example, the Rogowski coil 314 is an air core toroid. For example, the Rogowski coil 314 surrounds (e.g., encircles, encloses, encompasses, includes, etc.) the current path associated with the first network 308, where the current path is to be disposed in an inner portion of the Rogowski coil 314. The Rogowski coil 314 of FIG. 3 may implement the Rogowski coil 100 of FIG. 1 and/or the coil 214 of FIG. 2. The power conversion system 300 includes the SR control logic 216 of FIG. 2, which is coupled to output terminals of the Rogowski coil 314. Alternatively, the Rogowski coil 314 and/or the SR control logic 216 may be included in the power converter 302.

The power converter 302 includes the switch network 306 to generate a pulsating voltage or current from an example DC voltage source ($V_{IN}$) 315 and deliver the pulsating voltage or current to the first network 308. The switch network 306 includes a first example switch ($S_{1A}$) 316, a second example switch ($S_{2A}$) 318, a third example switch ($S_{1B}$) 320, and a fourth example switch ($S_{2B}$) 322. The first switch 316, the second switch 318, the third switch 320, and the fourth switch 322 are N-channel metal-oxide-semiconductor field-effect transistors (MOSFETs) (e.g., N-channel silicon MOSFETs, N-channel gallium nitride (GaN) MOSFETs, etc.). Alternatively, the first switch 316, the second switch 318, the third switch 320, and/or the fourth switch 322 may be a different type of transistor, such as an insulated-gate bipolar transistor (IGBT).

A drain terminal of the first switch 316 is coupled to a first terminal of the DC voltage source 315 and to a drain terminal of the second switch 318. Respective source terminals of the first switch 316 and the second switch 318 are coupled to respective drain terminals of the third switch 320 and the fourth switch 322. Respective source terminals of the third switch 320 and the fourth switch 322 are coupled to a second terminal of the DC voltage source 315.

The power converter 302 includes the first network 308 to receive the pulsating voltage or current from the switch network 306 and modulates its gain amplitude by changing a frequency of the pulsating voltage or current. The first network 308 is a resonant tank. For example, the first network 308 is a CLLLC resonant tank. The first network 308 includes a first example capacitor ($C_{R1}$) 324, a first example inductor ($L_{R1}$) 326, an example transformer (e.g., a power transformer) ($T_1$) 328, a second example inductor ($L_{R2}$) 330, and a second example capacitor ($C_{R2}$) 332. Windings of the transformer 328 have a corresponding example winding inductance ($L_M$) 334. For example, although the winding inductance 334 is depicted as a separate winding of the transformer 328, the winding inductance 334 is not a physical winding but a representation of an equivalent magnetics inductance of the windings of the transformer 328.

The source terminal of the first switch 316 and the drain terminal of the third switch 320 are coupled to a second terminal of a first winding of the transformer 328. The source terminal of the second switch 318 and the drain terminal of the fourth switch 322 are coupled to a first terminal (e.g., a first capacitor terminal, a first plate, a first capacitor plate, etc.) of the first capacitor 324. A second terminal (e.g., a second capacitor terminal, a second plate, a second capacitor plate, etc.) of the first capacitor 324 is coupled to a first terminal (e.g., a first inductor terminal) of the first inductor 326. A second terminal (e.g., a second inductor terminal) of the first inductor 326 is coupled to a first terminal of the first winding of the transformer 328.

A first terminal of a second winding of the transformer 328 is coupled to a first terminal of the second inductor 330. A second terminal of the second inductor 330 is coupled to a first terminal of the second capacitor 332. A second terminal of the second capacitor 332 is coupled to the second network 310. A second terminal of the second winding of the transformer 328 is coupled to an example terminal 312. For example, the second winding of the transformer 328 is coupled to the second network 310 via the terminal 312. In this example, the terminal 312 can be a current path terminal (e.g., a current path sensing terminal), a sensing terminal (e.g., a current sensing terminal), an output terminal, etc. In this example, the Rogowski coil 314 is arranged, configured, and/or otherwise disposed around a current path that is in circuit with the output terminal 312.

The power converter 302 includes the second network 310 to receive the pulsating voltage or current from the first network 308, rectify the pulsating voltage or current into a DC voltage or current, and deliver the DC voltage or current to the load 304. The second network 310 includes a fifth example switch ($S_{3A}$) 336, a sixth example switch ($S_{4A}$) 338, a seventh example switch ($S_{3B}$) 340, an eighth example switch ($S_{4B}$) 342, and a third example capacitor ($C_O$) 344. The fifth switch 336, the sixth switch 338, the seventh switch 340, and the eighth switch 342 are N-channel MOSFETs (e.g., N-channel silicon MOSFETs, N-channel GaN MOSFETs). Alternatively, the fifth switch 336, the sixth switch 338, the seventh switch 340, and/or the eighth switch 342 may be a different type of transistor, such as a bipolar junction transistor (BJT).

The second terminal of the second capacitor 332 is coupled to a source terminal of the fifth switch 336 and to a drain terminal of the seventh switch 340. The second terminal of the second winding of the transformer 328 is coupled to a source terminal of the sixth switch 338 and to a drain terminal of the eighth switch 342. Respective source terminals of the fifth switch 336 and the sixth switch 338 are coupled to respective drain terminals of the seventh switch 340 and the eighth switch 342. Respective drain terminals of the fifth switch 336 and the sixth switch 338 are coupled to a first terminal of the third capacitor 344. Respective source terminals of the seventh switch 340 and the eighth switch 342 are coupled to a second terminal of the third capacitor 344. The first and second terminals of the third capacitor 344 are coupled to the load 304. For example, the first terminal of the third capacitor 344 is coupled to a first load terminal of the load 304 and the second terminal of the third capacitor 344 is coupled to a second load terminal of the load 304.

In example operation, in response to turning on the second switch 318 and the third switch 320, current flows from the DC voltage source 315 through the second switch 318, the first capacitor 324, the first inductor 326, and the first winding of the transformer 328 to store energy in the winding inductor 334 as well as commute current to the second winding of the transformer 328. The current on the second winding of the transformer 328 conducts through the fifth switch 336 to the load and back through the eighth switch 342 (e.g., regardless of whether the fifth switch 336 and the eighth switch 342 are turned on or not with MOSFET applied as the fifth switch 336 and the eighth switch 342). Responsive to the commutation, current flows from the second winding of the transformer 328 through the second inductor 330, the second capacitor 332, and the fifth switch 336 to the load 304. Example time-varying current (i(t)) 348 returns from the load 304 through the eighth switch 342 and through a core of the Rogowski coil 314 to return to the second winding of the transformer 328.

The SR control logic 216 of FIG. 2 includes the integrator logic 218, the gain amplifier logic 220, the comparator logic 224, the slope detection logic 226, the blanking logic 228, and the PWM logic 230 of FIG. 2. Responsive to the time-varying current 348 flowing through the core of the Rogowski coil 314, the current-generated magnetic field induces a voltage on the windings of the Rogowski coil 314. The induced voltage has a phase difference (e.g., a 90 degree phase difference) when compared to the time-varying current 348.

The Rogowski coil 314 outputs a time-varying voltage at the output terminals of the Rogowski coil 314. The integrator logic 218 is coupled to the output terminals of the Rogowski coil 314 in a configuration to receive the time-varying voltage. The integrator logic 218 generates a voltage (e.g., an integrated voltage, an integrator output voltage, etc.) based on the induced voltage that is in phase with the time-varying current 348 or, in some examples, has a predetermined and/or otherwise preselected phase difference (e.g., the integrator output voltage can lead the time-varying current 348) to compensate for propagation and/or control delay. Stated another way, the zero voltage crossing of the output from the integrator logic 218 can be set to be a little earlier than the zero-current crossing of the time-varying current 348 to accommodate for propagation and/or control delay.

Input terminals of the gain amplifier logic 220 are coupled to output terminals of the integrator logic 218 to amplify the integrated voltage and/or otherwise the voltage generated by the integrator logic 218. For example, the gain amplifier logic 220 can generate an amplified voltage (e.g., an amplified integrated voltage) based on the integrated voltage received from the integrator logic 218. The gain amplifier logic 220 may provide amplification so that there is sufficient signal for different logic, such as the comparator logic 224, to determine timings of SR driving signals (e.g., one or more example control signals 350, 352, 354, 356).

As an example, if it is assumed that the time-varying current 348 is i(t), and that the Rogowski coil 314 is arranged vertically on the SR winding (e.g., the second winding of the transformer 328), then the Rogowski coil winding output voltage can be expressed below in Equation (1) as:

$$v_{1\_o}(t) = \frac{-AN\mu_0}{l}\frac{di(t)}{dt}, \qquad \text{Equation (1)}$$

where A is the cross section area of each turn on the Rogowski coil 314 (assuming the turns on the Rogowski coil 314 all have the same area of the cross section), N is the number of turns on the Rogowski coil 314, l is the circumference of the Rogowski coil ring, and $\mu_0 = 4\pi \cdot 10^{-7}$ H/m is the permeability constant.

If it is assumed that the gain amplifier logic 220 includes and/or otherwise implements an ideal operational amplifier (op-amp), the voltage relation between the Rogowski coil output $v_{1\_o}(t)$ and the integrator output voltage $v_{2\_o}(t)$ can be expressed below in Equation (2) as:

$$\frac{dv_{2\_o}(t)}{dt} + \left(\frac{1}{R_1 C_1} + \frac{1}{R_2 C_1}\right)v_{2\_o}(t) = \frac{v_{1\_o}(t)}{R_1 C_1}. \qquad \text{Equation (2)}$$

The differential equation in (2) above can be solved in the form of:

$$v_{2\_o}(t) = \frac{1}{I}\int I \frac{v_{1\_o}(t)}{R_1 C_1} dt + \frac{a_0}{I},$$

where $a_0$ is a constant and $$I = e^{\left(\frac{1}{R_1 C_1} + \frac{1}{R_2 C_1}\right)t + const.}.$$

To easier understand how to adjust phase difference with the integrator and the amplifier, it may be assumed that the SR current is purely sinusoidal, which will make both the Rogowski coil output voltage and the integrator output also sinusoidal. Thus, if $v_{2\_o}(t) = a_1 \sin(\omega t)$, Equation (2) above can be rewritten as:

$$a_1\omega\cos(\omega t) + a_2\sin(\omega t) = \frac{v_{1\_o}(t)}{R_1 C_1}, \text{ where} \qquad \text{Equation (3)}$$

$$a_2 = a_1\left(\frac{1}{R_1 C_1} + \frac{1}{R_2 C_1}\right).$$

The Rogowski coil output voltage can thus be derived as:

$$v_{1\_o}(t) = a_1 \sin(\omega t + \Phi), \qquad \text{Equation (4)}$$

where $$\Phi = \tan^{-1}\left(\frac{a_1\omega}{a_2}\right) = \tan^{-1}\left[\frac{\omega}{\left(\frac{1}{R_1 C_1} + \frac{1}{R_2 C_1}\right)}\right].$$

If Equation (4) above is substituted into (1), then the SR current can be expressed as:

$$i(t) = \frac{a_1 l}{AN\mu_0} \sin\left(\omega t + \Phi + \frac{\pi}{2}\right).\qquad\text{Equation (5)}$$

If the pin-outs of the Rogowski coil 314 are flipped, the SR current then becomes:

$$i(t) = \frac{a_1 l}{AN\mu_0} \sin\left(\omega t + \Phi - \frac{\pi}{2}\right).\qquad\text{Equation (6)}$$

In other words, when $$|\Phi| = \frac{\pi}{2}$$

is true by varying me values of $R_1$, $R_2$, $C_1$, and switching frequency $f_s$ ($\omega=2\pi f_s$) with right connection polarity between the Rogowski coil output and the integrator input, the integrator output $v_{2\_0}(t)$ will be in phase with the SR current $i(t)$. In some examples, the integrator waveform is desired to lead the SR current to compensate for propagation and/or control delay. Such a phase difference can be obtained by adjusting the RC values.

Output terminals of the gain amplifier logic 220 are coupled to input terminals of at least one of the comparator logic 224, the blanking logic 228, or the PWM logic 230. The output terminals of the gain amplifier logic 220 are coupled to input terminals of the slope detection logic 226. An input terminal of the slope detection logic 226 is coupled to an output terminal of at least one of the comparator logic 224, the blanking logic 228, or the PWM logic 230. An output terminal of the slope detection logic 226 is coupled to an input terminal of at least one of the comparator logic 224, the blanking logic 228, or the PWM logic 230.

The comparator logic 224 is configured to receive the amplified voltage that corresponds to the time-varying current 348. The comparator logic 224 compares the amplified voltage to a threshold and determines whether the amplified voltage satisfies the threshold based on the comparison. For example, during a positive switching cycle of the power converter 302, the comparator logic 224 can compare the amplified voltage to a zero-crossing threshold representative of approximately zero voltage. In such examples, in response to the comparator logic 224 determining that the amplified voltage is less than the zero-crossing threshold, the comparator logic 224 determines that the amplified voltage has transitioned from a positive value to a negative value.

Responsive to the threshold being satisfied, the PWM logic 230 can generate one or more example control signals 350, 352, 354, 356 to control one(s) of fifth switch 336, the sixth switch 338, the seventh switch 340, and/or the eighth switch 342. For example, the PWM logic 230, and/or, more generally, the SR control logic 216, can be configured to output control signals (e.g., respective control signal, respective control signals, etc.), such as the control signals 350, 352, 354, 356. The control signals 350, 352, 354, 356 include a first example control signal (DRV_S3A) 350 to control (e.g., turn on, turn off, etc.) the fifth switch 336, a second example control signal (DRV_S4A) 352 to control (e.g., turn on, turn off, etc.) the sixth switch 338, a third example control signal (DRV_S3B) 354 to control (e.g., turn on, turn off, etc.) the seventh switch 340, and a fourth example control signal (DRV_S4B) 356 to control (e.g., turn on, turn off, etc.) the eighth switch 356. For example, a first output terminal of the PWM logic 230, and/or, more generally, the SR control logic 216 can be coupled to a first gate terminal of the fifth switch 336. A second output terminal of the PWM logic 230, and/or, more generally, the SR control logic 216 can be coupled to a second gate terminal of the sixth switch 338. A third output terminal of the PWM logic 230, and/or, more generally, the SR control logic 216 can be coupled to a third gate terminal of the seventh switch 340. A fourth output terminal of the PWM logic 230, and/or, more generally, the SR control logic 216 can be coupled to a fourth gate terminal of the eighth switch 342. For example, the PWM logic 230 effectuates SR control of the power converter 302 based on whether the amplified voltage satisfies a threshold, such as a zero-crossing threshold.

The slope detection logic 226 is configured to adjust a threshold utilized by the comparator logic 224 based on the amplified voltage. For example, the slope detection logic 226 can determine a load condition (e.g., a heavy load condition, a light or low load condition, etc.) of the load 212 by determining a slope of the amplified integrated voltage. The slope detection logic 226 receives example blanking time signal(s) ($T_{BLANK}$) 358 to avoid and/or otherwise reduce a likelihood of noise affecting the slope detection logic 226 from generating an erroneous result or output. In some examples, the blanking time signal(s) 358 includes one or more blanking time signals (e.g., a first blanking time signal corresponding to a first blanking time window, a second blanking time signal corresponding to a second blanking time window, etc.). Responsive to the determination of the load condition, the slope detection logic 226 can determine a new, updated, and/or otherwise adjusted example threshold ($V_{COMP\_TH}$) 360. Responsive to the determination of the adjusted threshold 360, the comparator logic 224 can determine whether the amplified integrated voltage satisfies the adjusted threshold 360.

Figure 4:
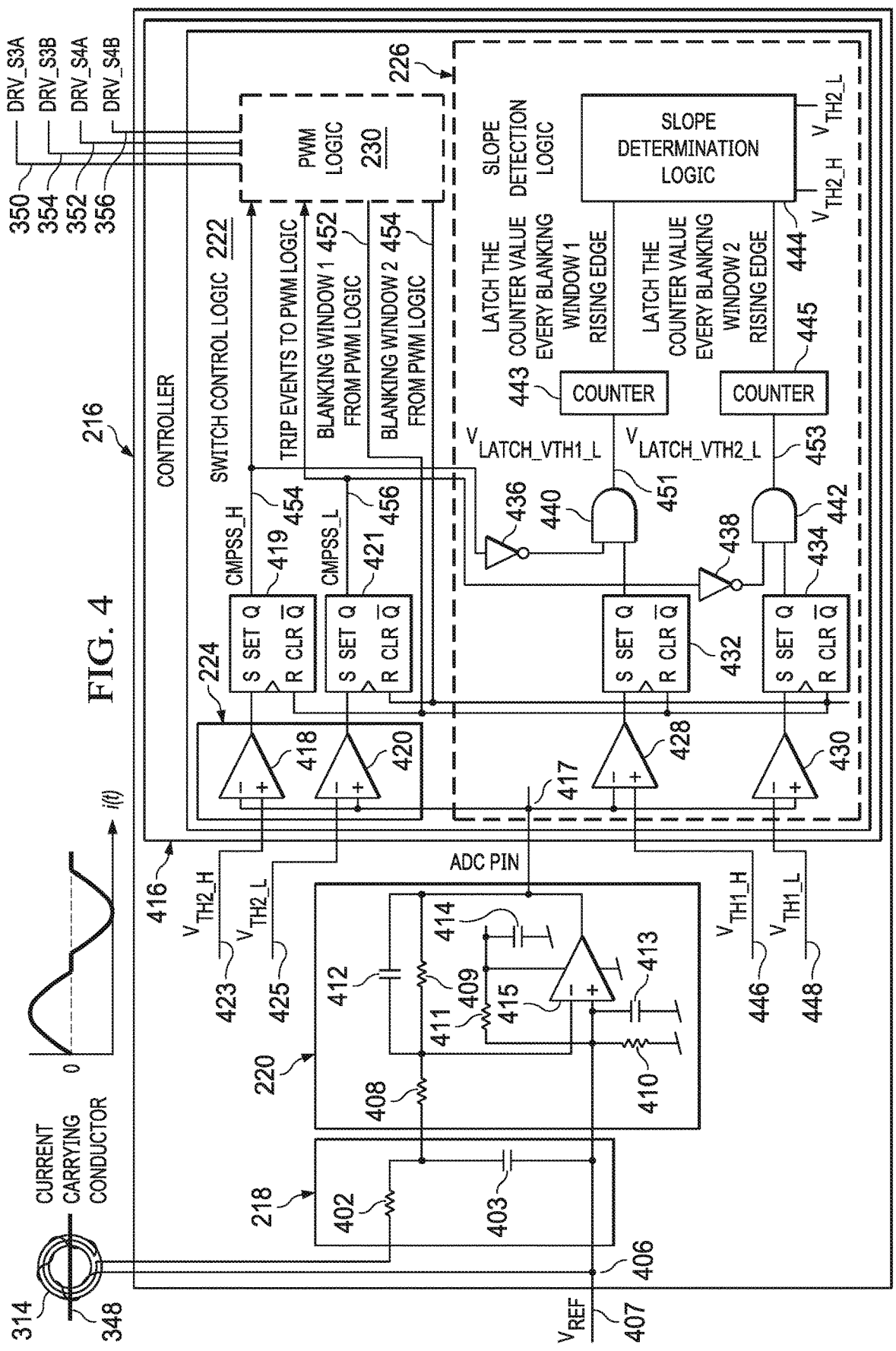
FIG. 4 is a schematic illustration of an example implementation of the SR control logic of FIGS. 2 and/or 3.

FIG. 4 is a schematic illustration of an example implementation of the SR control logic 216 of FIGS. 2 and/or 3 coupled to the Rogowski coil 314 of FIG. 3. The SR control logic 216 includes an example implementation of the integrator logic 218 of FIGS. 2 and/or 3, an example implementation of the gain amplifier logic 220 of FIGS. 2 and/or 3, and an example implementation of the switch control logic 222 of FIGS. 2 and/or 3. The example implementation of the switch control logic 222 includes an example implementation of the comparator logic 224 of FIGS. 2 and/or 3, an example implementation of the slope detection logic 226 of FIGS. 2 and/or 3, an example implementation of the blanking logic 228 of FIGS. 2 and/or 3, and an example implementation of the PWM logic 230 of FIGS. 2 and/or 3.

The example implementation of the integrator logic 218 depicted in the illustrated example of FIG. 4 is a logic circuit (e.g., an integrator logic circuit) or logic circuitry (e.g., integrator logic circuitry). In this example, the integrator logic 218 is implemented by a passive resistor-capacitor (RC) based integrator. The passive RC based integrator includes a first example resistor 402 and a first example capacitor 403. Alternatively, the integrator logic 218 may be implemented with any other type of passive integrator or with an active integrator.

A first terminal (e.g., a first coil terminal, a first output terminal, a first Rogowski coil terminal, etc.) of the Rogowski coil 314 is coupled to an example node 406. An example reference voltage ($V_{REF}$) 407 is present at the node 406 during operation. A second terminal (e.g., a second coil terminal, a second output terminal, a second Rogowski coil terminal, etc.) of the Rogowski coil 314 is coupled to a first terminal of the first resistor 402. A second terminal of the first resistor 402 is coupled to a first terminal of the first capacitor 403 and to the gain amplifier logic 220. A second terminal of the first capacitor 403 is coupled to the node 406.

The example implementation of the gain amplifier logic 220 depicted in the illustrated example of FIG. 4 is a logic circuit (e.g., a gain amplifier circuit, a gain amplifier logic circuit, etc.) or logic circuitry (e.g., gain amplifier logic circuitry). In this example, the gain amplifier logic 220 is implemented by an op-amp circuit, which includes a second example resistor 408, a third example resistor 409, a fourth example resistor 410, a fifth example resistor 411, a second example capacitor 412, a third example capacitor 413, a fourth example capacitor 414, and an example op-amp 415. Alternatively, the gain amplifier logic 220 may be implemented with any other type of amplifier circuit.

A first terminal of the second resistor 408 is coupled to the second terminal of the first resistor 402 and to the first terminal of the first capacitor 403. A second terminal of the second resistor 408 is coupled to a first terminal of the third resistor 409, a first terminal of the second capacitor 412, and to a first terminal (e.g., a first input terminal, a first op-amp terminal, a first op-amp input terminal, etc.) of the op-amp 415 (designated with a '-' symbol). A second terminal (e.g., a second input terminal, a second op-amp terminal, a second op-amp input terminal, etc.) of the op-amp 415 (designated with a '+' symbol) is coupled to the node 406, to a second output terminal of the Rogowski coil 314, to a second terminal of the first capacitor 403, to a first terminal of the fourth resistor 410, a first terminal of the third capacitor 413, and to a first terminal of the fifth resistor 411. A second terminal of the fifth resistor 411 is coupled to an input terminal (e.g., a voltage input terminal) of the op-amp 415 and to a first terminal of the fourth capacitor 414. An output terminal (e.g., an op-amp output terminal) of the op-amp 415 is coupled to a second terminal of the third resistor 409, and to a second terminal of the second capacitor 412. The output terminal of the op-amp 415 is coupled to an example terminal 417. The comparator logic 224 and the slope detection logic 226 are coupled to the terminal 417. In this example, the terminal 417 is an analog-to-digital (ADC) pin.

The example implementation of the switch control logic 222 depicted in the illustrated example of FIG. 4 is an example controller 416. For example, the controller 416 can correspond to one or more microcontrollers (e.g., one or more analog microcontrollers, one or more digital microcontrollers, etc.) that include analog and/or digital peripherals for sensing and/or measurement functions. In such examples, the controller 416 can include one or more programmable gain amplifiers (PGAs), one or more comparators, one or more transimpedance amplifiers, one or more operational amplifiers, etc., and/or a combination thereof. In some examples, the controller 416 can be representative of one or more controllers (e.g., microcontrollers) that execute machine readable instructions. In some examples, the controller 416 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)).

In this example, the controller 416 includes the switch control logic 222, the comparator logic 224, the slope detection logic 226, the blanking logic 228, and the PWM logic 230. The example implementation of the comparator logic 224 depicted in the illustrated example of FIG. 4 is a logic circuit (e.g., a comparator logic circuit) or logic circuitry (e.g., comparator logic circuitry). In this example, the comparator logic 224 is implemented by a comparator circuit, which includes a first example comparator 418 and a second example comparator 420. Alternatively, the comparator logic 224 may be implemented with any other type of comparator circuit.

A first input terminal (e.g., a first comparator input terminal) of the first comparator 418 (designated with a '-' symbol) is coupled to the output terminal of the op-amp 412 via the terminal 417. A second input terminal (e.g., a second comparator input terminal) of the first comparator 418 (designated with a '+' symbol) is coupled to a terminal having a voltage corresponding to a third example voltage threshold ($V_{TH2\_H}$) 423. The third voltage threshold 423 is an adjustable, tunable, and/or otherwise dynamic voltage threshold. For example, the third voltage threshold 423 can be adjusted by the slope determination logic 444 based on the amplified integrated voltage. An output terminal (e.g., a comparator output terminal) of the first comparator 418 is coupled to a set terminal (e.g., a set input terminal, an SR input terminal, etc.) of a first example set-reset (SR) latch 419 (designated with 'S'). A reset terminal (e.g., a reset input terminal, an SR input terminal, etc.) of the first SR latch 419 (designated with 'R') is coupled to a first output terminal of the PWM logic 230. An output terminal of the first SR latch 419 is coupled to a first input terminal of the PWM logic 230. The output terminal of the first SR latch 419 is configured to generate a first example trip event signal (CMPSS_H) 454.

A first input terminal of the second comparator 420 (designated with a symbol) is coupled to a terminal having a voltage corresponding to a fourth example voltage threshold ($V_{TH2\_L}$) 425. The fourth voltage threshold 425 is an adjustable, tunable, and/or otherwise dynamic voltage threshold. For example, the fourth voltage threshold 425 can be adjusted by the slope determination logic 444 based on the amplified integrated voltage. A second input terminal of the second comparator 420 (designated with a '+' symbol) is coupled to the terminal 417. An output terminal of the second comparator 420 is coupled to a set terminal (designated with 'S') of a second example SR latch 421. A reset terminal of the second SR latch 421 (designated with 'R') is coupled to a second output terminal of the PWM logic 230. An output terminal of the second SR latch 421 is coupled to a second input terminal of the PWM logic 230. The output terminal of the second SR latch 421 is configured to generate a second example trip event signal (CMPSS_L) 456.

The example implementation of the blanking logic 228 depicted in the illustrated example of FIG. 4 is a logic circuit (e.g., a blanking logic circuit) or logic circuitry (e.g., blanking logic circuitry). In this example, the blanking logic 228 is implemented by the PWM logic 230. Alternatively, the blanking logic 228 may be implemented with any other type of blanking circuit, which may include a different quantity and/or type of logic gate(s).

The example implementation of the slope detection logic 226 depicted in the illustrated example of FIG. 4 is a logic circuit (e.g., a slope detection logic circuit) or logic circuitry (e.g., slope detection logic circuitry). In this example, the slope detection logic 226 is implemented by a third example comparator 428, a fourth example comparator 430, a third example SR latch 432, a fourth example SR latch 434, a first example inverter (e.g., a first inverting logic gate) 436, a second example inverter (e.g., a second inverting logic gate) 438, a first example AND gate (e.g., a first AND logic gate) 440, a second example AND gate (e.g., a second AND logic gate) 442, a first example counter 443, a second example counter 445, and example slope determination logic 444. In this example, the slope determination logic 444 is hardware. For example, the slope determination logic 444 can be a hardware-implemented state machine, a controller (e.g., an analog controller, a digital controller, etc.), etc. Alternatively, the slope detection logic 226 may be implemented with fewer or more comparators, inverters, logic gates, latches, counters, and/or thresholds than depicted in the example of FIG. 4.

A first input terminal (e.g., a first comparator input terminal) of the third comparator 428 (designated with a '−' symbol) is coupled to the terminal 417. A second input terminal (e.g., a second comparator input terminal) of the third comparator 428 (designated with a '+' symbol) is configured to receive a first example voltage threshold ($V_{TH1\_H}$) 446. For example, the second input terminal is coupled to a terminal at which the first voltage threshold 446 can be present. In such examples, the slope determination logic 444 can generate the first voltage threshold 446. In this example, the first voltage threshold 446 is a fixed or pre-determined voltage threshold. Alternatively, the first voltage threshold 446 may be adjusted (e.g., dynamically adjusted) by the slope determination logic 444 based on the amplified integrated voltage. An output terminal (e.g., a comparator output terminal) of the third comparator 428 is coupled to a set terminal (designated with 'S') of a third example SR latch 432. A reset terminal of the third SR latch 432 (designated with 'R') is coupled to the first output terminal of the PWM logic 230. An output terminal of the third SR latch 432 (designated with 'Q') is coupled to a first input terminal of the first AND gate 440. A second input terminal of the first AND gate 440 is coupled to an output terminal of the first inverter 436. An input terminal of the first inverter 436 is coupled to the output terminal of the first SR latch 419. An output terminal of the first AND gate 440 is coupled to an input terminal of a first example counter 443. An output terminal of the first counter 443 is coupled to a first input terminal of the slope determination logic 444.

A first input terminal of the fourth comparator 430 (designated with a '-' symbol) is configured to receive a second example voltage threshold ($V_{TH1\_L}$) 448. In this example, the second voltage threshold 448 is a fixed or pre-determined voltage threshold. Alternatively, the second voltage threshold 448 may be adjusted (e.g., dynamically adjusted by the slope determination logic 444 based on the amplified integrated voltage. An output terminal of the fourth comparator 430 is coupled to a set terminal (designated with 'S') of a fourth example SR latch 434. A reset terminal of the fourth SR latch 434 (designated with 'R') is coupled to the second output terminal of the PWM logic 230. An output terminal of the fourth SR latch 434 (designated with 'Q') is coupled to a first input terminal of the second AND gate 442. A second input terminal of the fourth comparator 430 (designated with a '+' symbol) is coupled to the terminal 417. A second input terminal of the second AND gate 442 is coupled to an output terminal of the second inverter 438. An input terminal of the second inverter 438 is coupled to the output terminal of the second SR latch 421. An output terminal of the second AND gate 442 is coupled to an input terminal of a second example counter 445. An output terminal of the second counter 445 is coupled to a second input terminal of the slope determination logic 444.

In example operation, the time-varying current 348 flows through an inner portion of the Rogowski coil 314. Responsive to the flow of the time-varying current 348, a voltage is induced on the coil windings of the Rogowski coil 314, which is out-of-phase from time-varying current 348. Responsive to the inducement, the Rogowski coil 314 outputs the voltage to the passive integrator of the integrator logic 218 to align the phase of the voltage closer to the time-varying current 348 to generate an integrated voltage. Responsive to receiving the integrated voltage from the integrator logic 218, the op-amp 415 of the gain amplifier logic 220 amplifies the integrated voltage to generate an amplified integrated voltage.

In example operation, the first comparator 418 and/or the second comparator 420 compare the amplified integrated voltage to respective thresholds. For example, during a positive switching cycle in which the power converter 302 of FIG. 3 is operative to cause to the time-varying current 348 to be positive, the first comparator 418 asserts a first comparator output signal responsive to the amplified integrated voltage satisfying the third voltage threshold 423. In such examples, the first comparator 418 asserts the first comparator output signal responsive to a determination that the amplified integrated voltage has transitioned from a positive voltage to a negative voltage. In some such examples, the transition corresponds to a zero-crossing event. In some examples, the zero-crossing event leads and/or otherwise occurs prior to the time-varying current 348 transitioning from a positive current to a negative current.

In example operation, the first SR latch 419 implements the blanking logic 228 by asserting the first trip event signal 454 responsive to (i) the assertion of the first comparator output signal and (ii) a de-assertion of a first example blanking time signal 452 corresponding to a first blanking window from the first output terminal of the PWM logic 230. Advantageously, the first SR latch 419 prevents noise from causing a premature assertion of the first trip event signal 454 by waiting to assert the first trip event signal 454 until at least the first blanking time signal 452 is de-asserted.

In example operation, the first SR latch 419 transmits the assertion to the PWM logic 230. Responsive to the PWM logic 230 receiving the assertion of the first trip event signal 454, the PWM logic 230 generates one(s) of the control signal(s) 350, 352, 354, 356 to control one(s) of the switches 336, 338, 340, 342 to effectuate SR control of the power converter 302.

In other examples, during a negative switching cycle in which the power converter 302 of FIG. 3 is operative to cause to the time-varying current 348 to be negative, the second comparator 420 asserts a second comparator output signal responsive to the amplified integrated voltage satisfying the fourth voltage threshold 425. In such examples, the second comparator 420 asserts the second comparator output signal responsive to a determination that the amplified integrated voltage has transitioned from a negative voltage to a positive voltage. In some such examples, the transition corresponds to a zero-crossing event. In some examples, the zero-crossing event leads and/or otherwise occurs prior to the time-varying current 348 transitioning from a negative current to a positive current.

In example operation, the second SR latch 421 implements the blanking logic 228 by asserting the second trip event signal 456 responsive to (i) the assertion of the second comparator output signal and (ii) a de-assertion of a second example blanking time signal 454 corresponding to blanking window 2 from the second output terminal of the PWM logic 230. Advantageously, the second SR latch 421 prevents noise from causing a premature assertion of the second trip event signal 456 by waiting to assert the second trip event signal 456 until at least the second blanking time signal 454 is de-asserted. In this example, the blanking logic 228 is implemented by at least the first blanking time signal 454 and the second blanking time signal 456.

In example operation, the second SR latch 421 asserts the second trip event signal 456 and transmits the assertion to the PWM logic 230. Responsive to the PWM logic 230 receiving the assertion of the second trip event signal 456, the PWM logic 230 generates one(s) of the control signal(s) 350, 352, 354, 356 to control one(s) of the switches 336, 338, 340, 342 to effectuate SR control of the power converter 302.

In example operation, during a positive switching cycle, the slope detection logic 226 adjusts the third voltage threshold 423 and/or the fourth voltage threshold 425 based on a slope of the amplified integrated voltage. The slope detection logic 226 determines the slope based on a counter value difference between a first counter value corresponding to the amplified integrated voltage satisfying the first voltage threshold 446 and a second counter value corresponding to the amplified integrated voltage satisfying the third voltage threshold 423, where the first voltage threshold 446 is greater than the third voltage threshold 423. The third comparator 428 determines whether the amplified integrated voltage satisfies the first voltage threshold 446 based on a comparison of the amplified integrated voltage from the op-amp 415 and the first voltage threshold 446. In some examples, the third comparator 428 determines that the amplified integrated voltage satisfies the first voltage threshold 446 responsive to the amplified integrated voltage being less than the first voltage threshold 446. Responsive to the amplified integrated voltage satisfying the first voltage threshold 446, the third comparator 428 asserts the third comparator output signal to the set input of the third SR latch 432.

In example operation, the third SR latch 432 implements the blanking logic 228 by asserting an output signal responsive to (i) the assertion of the third comparator output signal and (ii) a de-assertion of the first blanking time signal 452. Advantageously, the third SR latch 432 prevents noise from causing a premature assertion of the output signal by waiting to assert the output signal until at least the first blanking time signal 452 is de-asserted.

In example operation, the third SR latch 432 asserts the output signal to the first AND gate 440. Responsive to receiving the asserted output signal from the third SR latch 432 and an assertion of an output signal from the first inverter 436, the first AND gate 440 asserts a first example voltage latch signal ($V_{LATCH\_VTH\_H}$) 451. Responsive to the assertion of the first voltage latch signal 451, the first AND gate 440 latches a first counter value of the first counter 443 to the first input terminal of the slope determination logic 444. Responsive to the slope determination logic 444 receiving the first counter value, the slope determination logic 444 stores the first counter value. In this example, the first counter value is representative, indicative of, and/or otherwise corresponding to a first time at which the assertion of the output signal from the third SR latch 432 has been received.

In example operation, the first AND gate 440 latches a second counter value of the first counter 443 to the first input terminal of the slope determination logic 444 based on the first comparator 418 determining that the integrated amplified voltage satisfies the third voltage threshold 423. For example, the first comparator 418 can assert the first comparator output to the set input of the first SR latch 419. Responsive to receiving the first comparator output at the set input, the first SR latch 419 asserts the first trip event signal 454, which causes the first inverter 436 to de-assert the inverter output signal to the first AND gate 440. Responsive to receiving the de-asserted inverter output signal, the first AND gate 440 de-asserts the first voltage latch signal 451, which causes the first counter 443 to latch a second counter value. Responsive to the slope determination logic 444 receiving the second counter value from the first counter 443, the slope determination logic 444 stores the second counter value. In this example, the second counter value is representative, indicative of, and/or otherwise corresponding to a second time at which the assertion of the first trip event signal 454 has been received from the first SR latch 419. Alternatively, the slope determination logic 444 may determine a first timestamp corresponding to the first time and a second timestamp corresponding to the second time.

In example operation, responsive to receiving the first counter value and the second counter value, the slope determination logic 444 determines the slope of the amplified integrator voltage based on a ratio of a first difference (e.g., a voltage difference) between the first voltage threshold 446 and the third voltage threshold 423 and a second difference (e.g., a time difference, a timestamp difference, hardware counter value difference etc.) between the first counter value and the second counter value.

In example operation, during a negative switching cycle, the slope detection logic 226 adjusts the third voltage threshold 423 and/or the fourth voltage threshold 425 based on a slope of the amplified integrated voltage. The slope detection logic 226 determines the slope based on a counter value difference between a third counter value corresponding to the amplified integrated voltage satisfying the second voltage threshold 448 and a fourth counter value corresponding to the amplified integrated voltage satisfying the fourth voltage threshold 425, where the second voltage threshold 448 is greater than the fourth voltage threshold 425. The fourth comparator 430 determines whether the amplified integrated voltage satisfies the second voltage threshold 448 based on a comparison of the amplified integrated voltage from the op-amp 415 and the second voltage threshold 448. In some examples, the fourth comparator 430 determines that the amplified integrated voltage satisfies the second voltage threshold 448 responsive to the amplified integrated voltage being less than the second voltage threshold 448. Responsive to the amplified integrated voltage satisfying the second voltage threshold 448, the fourth comparator 430 asserts the fourth comparator output signal to the set input of the fourth SR latch 434.

In example operation, the fourth SR latch 434 implements the blanking logic 228 by asserting an output signal responsive to (i) the assertion of the fourth comparator output signal and (ii) a de-assertion of the second blanking time signal 454. Advantageously, the fourth SR latch 434 prevents noise from causing a premature assertion of the output signal by waiting to assert the output signal until at least the second blanking time signal 454 is de-asserted.

In example operation, the fourth SR latch 434 asserts the output signal to the second AND gate 442. Responsive to receiving the asserted output signal from the fourth SR latch 434 and an assertion of an output signal from the second inverter 438, the second AND gate 442 asserts a second example voltage latch signal ($V_{LATCH\_VTH1\_L}$) 453. Responsive to the assertion of the second voltage latch signal 453, the second AND gate 442 latches a third counter value of the second counter 445 to the second input terminal of the slope determination logic 444. Responsive to the slope determination logic 444 receiving the third counter value, the slope determination logic 444 stores the third counter value. In this example, the third counter value is representative, indicative of, and/or otherwise corresponding to a third time at which the assertion of the output signal from the fourth SR latch 434 has been received.

In example operation, the second AND gate 442 latches a fourth counter value of the second counter 445 to the second input terminal of the slope determination logic 444 based on the second comparator 420 determining that the integrated amplified voltage satisfies the fourth voltage threshold 425. For example, the second comparator 420 can assert the second comparator output to the set input of the second SR latch 421. Responsive to receiving the second comparator output at the set input, the second SR latch 421 asserts the second trip event signal 456, which causes the second inverter 438 to de-assert the inverter output signal to the second AND gate 442. Responsive to receiving the de-asserted inverter output signal, the second AND gate 442 de-asserts the second voltage latch signal 453, which causes the second counter 445 to latch a fourth counter value. Responsive to the slope determination logic 444 receiving the fourth counter value from the second counter 445, the slope determination logic 444 stores the fourth counter value. In this example, the fourth counter value is representative, indicative of, and/or otherwise corresponding to a second time at which the assertion of the second trip event signal 456 has been received from the second SR latch 421. Alternatively, the slope determination logic 444 may determine a third timestamp corresponding to the third time and a fourth timestamp corresponding to the fourth time.

In example operation, responsive to receiving the third counter value and the fourth counter value, the slope determination logic 444 determines the slope of the amplified integrator voltage based on a ratio of a second difference (e.g., a voltage difference) between the second voltage threshold 448 and the fourth voltage threshold 425 and a second difference (e.g., a time difference, a timestamp difference, hardware counter value difference etc.) between the third counter value and the fourth counter value.

In example operation, the slope determination logic 444 adjusts the third voltage threshold 423 and/or the fourth voltage threshold 425 based on at least one of the slope or a load condition associated with a power converter, such as the power converter 302 of FIG. 3. For example, the slope determination logic 444 determines a load condition (e.g., a light load condition, a medium load condition, a heavy load condition, etc.) based on the slope. In such examples, the slope determination logic 444 can determine that the power converter 302 is under relatively heavy load responsive to a relatively high value for the slope. In some examples, the slope determination logic 444 determines that the power converter 302 is under relatively light load responsive to a relatively low value for the slope.

In some examples, the slope determination logic 444 adjusts the third voltage threshold 423 and/or the fourth voltage threshold 425 based on the load determination of the power converter 302. For example, the slope determination logic 444 can increase the third voltage threshold 423 and/or the fourth voltage threshold 425 from a first value to a second value based on the determination that the power converter 302 is under relatively heavy load. In other examples, the slope determination logic 444 can decrease the third voltage threshold 423 and/or the fourth voltage threshold 425 from a third value to a fourth value based on the determination that the power converter 302 is under relatively light load.

In some examples, responsive to the heavy load determination or a determination that the load condition has changed from a light load to a heavy load, the slope determination logic 444 determines a voltage threshold to be used for a subsequent or future switching cycle as described below in Equation (7):

$$|V_{TH2,n+1}| = V_0 - \frac{|V_{TH1}| - |V_{TH2,n}|}{t_{TH1} - t_{TH2,n}}\left(t_d - \frac{\Phi}{\omega}\right),\quad \text{Equation (7)}$$

where $V_0$ is a midpoint of the output voltage of the integrator logic 218.

$$\frac{\Phi}{\omega} = t_{ZC} - t_0,$$

$V_{TH1}$ is the first voltage threshold 446 (e.g., during a positive switching cycle) or the second voltage threshold 448 (e.g., during a negative switching cycle), $V_{TH2,n+2}$ is the third voltage threshold 423 (e.g., during a positive switching cycle) or the fourth voltage threshold 425 (e.g., during a negative switching cycle) at a current or instant switching cycle, and $V_{TH2,n+1}$ is the third voltage threshold 423 or the fourth voltage threshold 425 at a subsequent, next, or future switching cycle, and $t_d$ is the propagation delay. In the example of Equation (7) above, $t_{TH1}$ is a first time value (e.g., a first hardware counter value, a first timestamp, etc.) at which is satisfied and $t_{TH2,n}$ is a second time value (e.g., a second hardware counter value, a second timestamp, etc.) at which $V_{TH2,n}$ is satisfied. In such examples, the slope determination logic 444 adjusts the third voltage threshold 423 and/or the fourth voltage threshold 425 to be $V_{TH2,n+1}$ for the next switching cycle.

In some examples, responsive to the light load determination or a determination that the load condition has changed from a heavy load to a light load, the slope determination logic 444 determines a voltage threshold to be used for a subsequent or future switching cycle as described below in Equation (8):

$$|V_{TH2,n+1}| = V_0 - \frac{|V_{TH1}| - |V_{TH2,n}|}{t_{TH1'} - t_{TH2,n'}}\left(t_d - \frac{\Phi}{\omega}\right),\quad \text{Equation (8)}$$

where $V_0$ is a midpoint of the output voltage of the integrator logic 218.

$$\frac{\Phi}{\omega} = t_{ZC} - t_0,$$

$V_{TH1}$ is the first voltage threshold 446 (e.g., during a positive switching cycle) or the second voltage threshold 448 (e.g., during a negative switching cycle), $V_{TH2,n}$ is the third voltage threshold 423 (e.g., during a positive switching cycle) or the fourth voltage threshold 425 (e.g., during a negative switching cycle) at a current or instant switching cycle, and $V_{TH2,n+1}$ is the third voltage threshold 423 and/or the fourth voltage threshold 425 at a subsequent, next, or future switching cycle. In the example of Equation (8) above, $t_{TH1}$, is a third time value (e.g., a third hardware counter value, a third timestamp, etc.) at which $V_{TH1}$ is satisfied and $t_{TH2,n}$, is a fourth time value (e.g., a fourth hardware counter value, a fourth timestamp, etc.) at which $V_{TH2,n}$ is satisfied. In such examples, the slope determination logic 444 adjusts the third voltage threshold 423 and/or the fourth voltage threshold 425 to be $V_{TH2,n+1}$ for the next switching cycle.

Advantageously, by effectuating adaptive SR turn-off control based on the slope of the amplified integrated voltage, the control signal(s) 350, 352, 354, 356 can generated to optimize and/or otherwise improve turn-off timing under different loads (e.g., different load conditions) of the power converter 302, and/or, more generally, the power conversion system 300. Advantageously, the slope detection logic 226 can dynamically adjust the third voltage threshold 423 and/or the fourth voltage threshold 425 based on the slope to effectuate precise and/or otherwise increasingly accurate positioning of PWM signals generated by the PWM logic 230.

Figure 5:
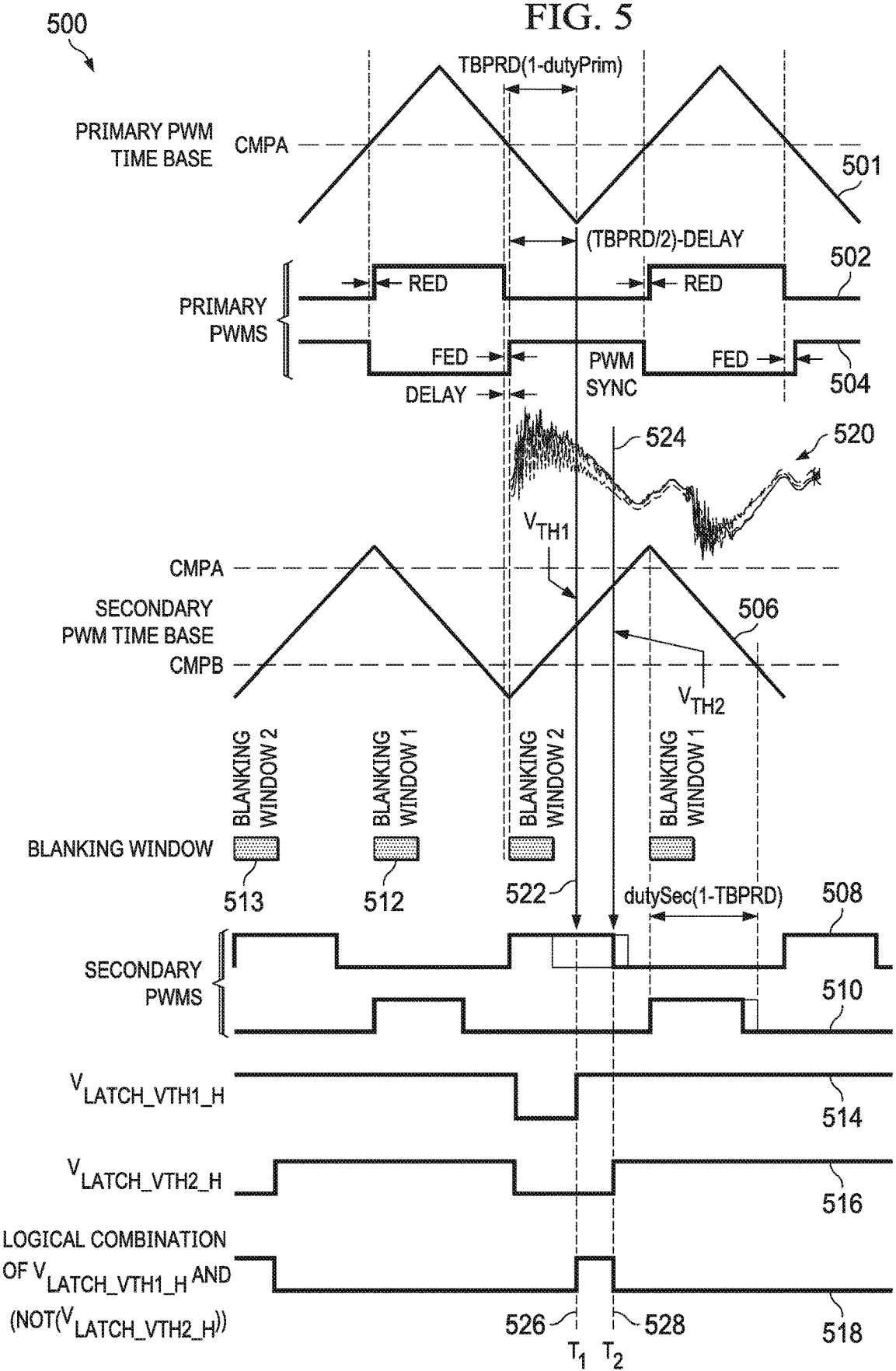
FIG. 5 is an example timing diagram including example pulse-width modulation (PWM) waveforms generated by an example controller.

FIG. 5 depicts an example timing diagram 500 including first example PWM waveforms 501, 502, 504 and second example PWM waveforms 506, 508, 510 generated by the PWM logic 230 of FIGS. 2 and/or 4. The first PWM waveforms 501, 502, 504 include an example primary PWM time base 501, a first example primary PWM 502, and a second example primary PWM 504. The second PWM waveforms 506, 508, 510 include an example secondary PWM time base 506, a first example secondary PWM 508, and a second example secondary PWM 510.

Further depicted in FIG. 5 are example blanking windows 512, 513, a first example latch waveform 514, a second example latch waveform 516, an example latch combination waveform 518, amplified integrated voltage waveforms 520, a first example voltage threshold ($V_{TH1}$) 522, and a second example voltage threshold ($V_{TH2}$) 524. In this example, the blanking windows 512, 513 include a first example blanking window (BLANKING WINDOW 1) 512 and a second example blanking window (BLANKING WINDOW 2) 513. The first blanking window 512 can correspond to the blanking time signal(s) 358 of FIG. 3 and/or the first blanking time signal 452 of FIG. 4. The second blanking window 513 can correspond to the blanking time signal 358(s) of FIG. 3 and/or the second blanking time signal 454 of FIG. 4.

In this example, the first latch waveform 514 corresponds to the first voltage latch signal 451 of FIG. 4. In this example, the second latch waveform 516 corresponds to the second voltage latch signal 453 of FIG. 4. In this example, the latch combination waveform 518 corresponds to a logical combination of the first voltage latch signal 451 and a not operator executed on the second voltage latch signal 453. For example, the latch combination waveform 518 can be generated by the slope determination logic 444 of FIG. 4. In this example, the amplified integrated voltage waveforms 520 correspond to the output from the gain amplifier logic 220 of FIGS. 2, 3, and/or 4. In this example, the first voltage threshold 522 can be the first voltage threshold 446 of FIG. 4. In this example, the second voltage threshold 524 can be the third voltage threshold 423 of FIG. 4.

At a first example time ($T_1$) 526, a first value of the amplified integrated voltage waveform 520 crosses, meets, and/or otherwise satisfies the first voltage threshold 522. At the first time 526, the blanking window 512 has elapsed, expired, ended, etc. At the first time 526, the first latch waveform 514 is asserted responsive to the first value of the amplified integrated voltage waveform 520 being less than the first voltage threshold 522.

At a second example time ($T_2$) 528, a second value of the amplified integrated voltage waveform 520 crosses, meets, and/or otherwise satisfies the second voltage threshold 524. At the second time 528, the second blanking window 513 has elapsed, expired, ended, etc. At the second time 528, the second latch waveform 516 is asserted responsive to the second value of the amplified integrated voltage waveform 520 being less than the second voltage threshold 524. At the second time 528, the latch combination waveform 518 is asserted responsive to the assertion of the first latch waveform 514 and a de-assertion of the second latch waveform 516.

Advantageously, the switch control logic 222, and/or, more generally, the controller 416 of FIG. 4, controls the PWM logic 230 to provide and/or otherwise effectuate flexible PWM blanking at zero and period to avoid noise from affecting the PWM behavior. For example, the blanking windows 512, 513 can be used to mitigate any noise and chatter on the signals generated by the first latch waveform 514, the second latch waveform 516, and/or the latch combination waveform 518. In this example, the first latch waveform 514 and the second latch waveform 516 are latched until the next PWM time base zero to avoid any spurious signals coming into the delta time measurement. In some examples, the latch combination waveform 518 can be fed and/or otherwise delivered to a high-resolution capture peripheral or other hardware for determining precise time delay measurement(s). Advantageously, the switch control logic 222, and/or, more generally, the controller 416, can provide for the ability to define trip explicitly for Up count (e.g., responsive to the secondary PWM time base waveform 506 counting Up) and Down Count (e.g., responsive to the secondary PWM time base waveform 506 counting down) and to separate behaviors based on one shot trips (e.g., catastrophic trips) and identified SR events.

Figure 6:
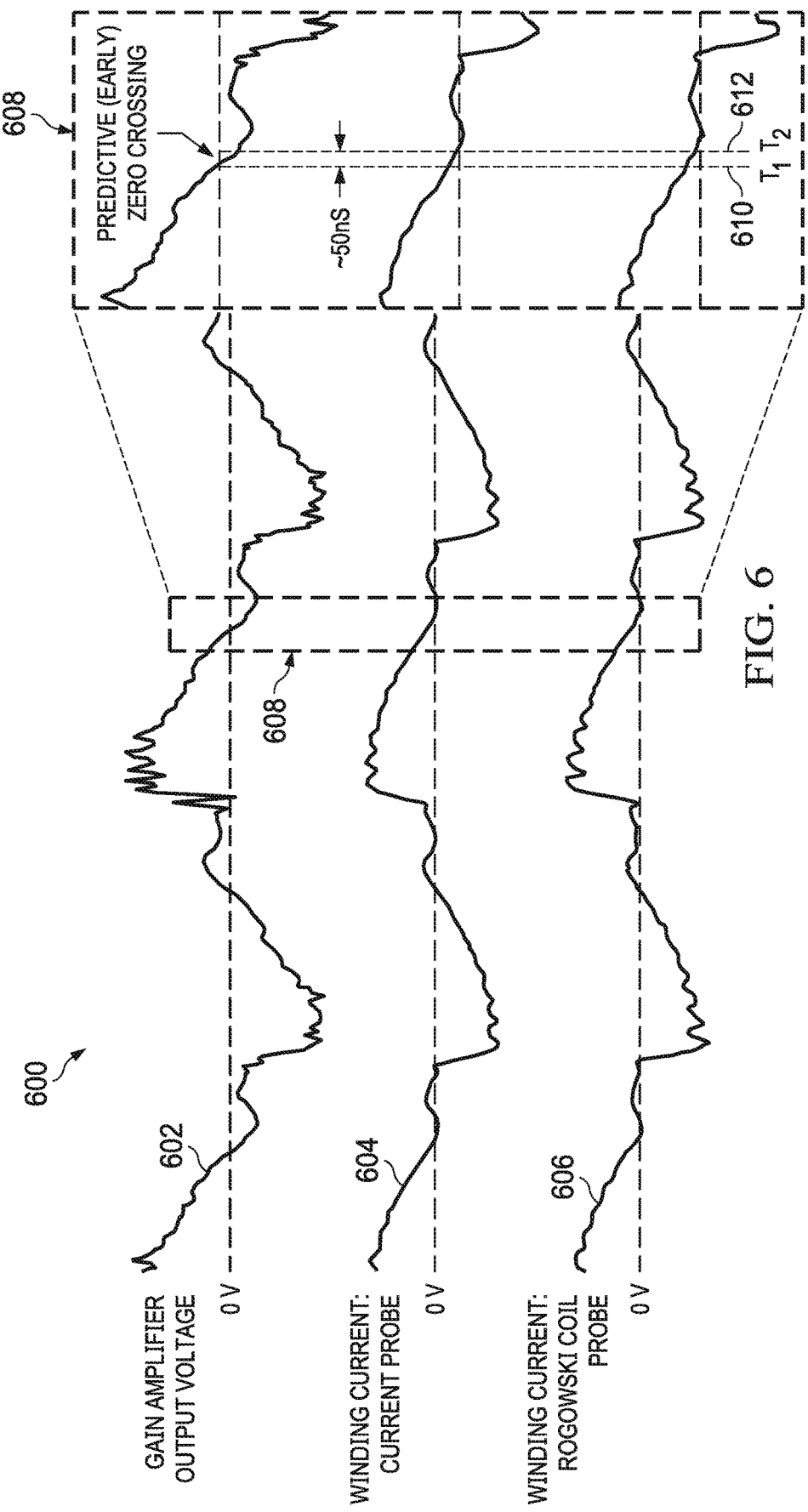
FIG. 6 is an example timing diagram including example waveforms associated with the example power converter of FIGS. 2 and/or 3.

FIG. 6 depicts example an example timing diagram 600 including example waveforms 602, 604, 606 associated with the power converter 210 of FIG. 2 and/or the power converter 302 of FIG. 3. The waveforms 602, 604, 606 include a first example waveform 602, a second example waveform 604, and a third example waveform 606. Further depicted in FIG. 6 is an example expanded view 608 that depicts a portion of the waveforms 602, 604, 606 with enhanced clarity.

In this example, the first waveform 602 corresponds to the output voltage of the gain amplifier logic 220 of FIGS. 2 and/or 3. For example, the first waveform 602 can be representative of the output of the op-amp 415 of FIG. 4. In this example, the second waveform 604 corresponds to a current flowing through a winding of the transformer 328 of FIG. 3 For example, the second waveform 604 can be representative of an output of a current probe measuring and/or otherwise monitoring current flowing through the first winding of the transformer 328, the second winding of the transformer 328, etc. In this example, the third waveform 606 corresponds a current flowing through the coil 214 of FIG. 2 and/or the Rogowski coil 314 of FIG. 3. For example, the third waveform 606 can be representative of an output of a current probe measuring and/or otherwise monitoring current flowing through the core or inner portion of the coil 214, the Rogowski coil 314, etc.

The first waveform 602 meets, crosses, and/or otherwise satisfies a zero-crossing threshold (e.g., a zero-voltage threshold, 0 V, etc.) at a first example time ($T_1$) 610. The second waveform 604 meets, crosses, and/or otherwise satisfies the zero-crossing threshold at a second example time (T$_2$) 612. The third waveform 606 meets, crosses, and/or otherwise satisfies the zero-crossing threshold at the second time. Advantageously, the zero-crossing of the integrator logic 218 voltage output can be configured and/or otherwise programmed to be earlier than the actual current (e.g., the second waveform 604, the third waveform 606, etc.) to accommodate propagation and control delays.

Figure 7:
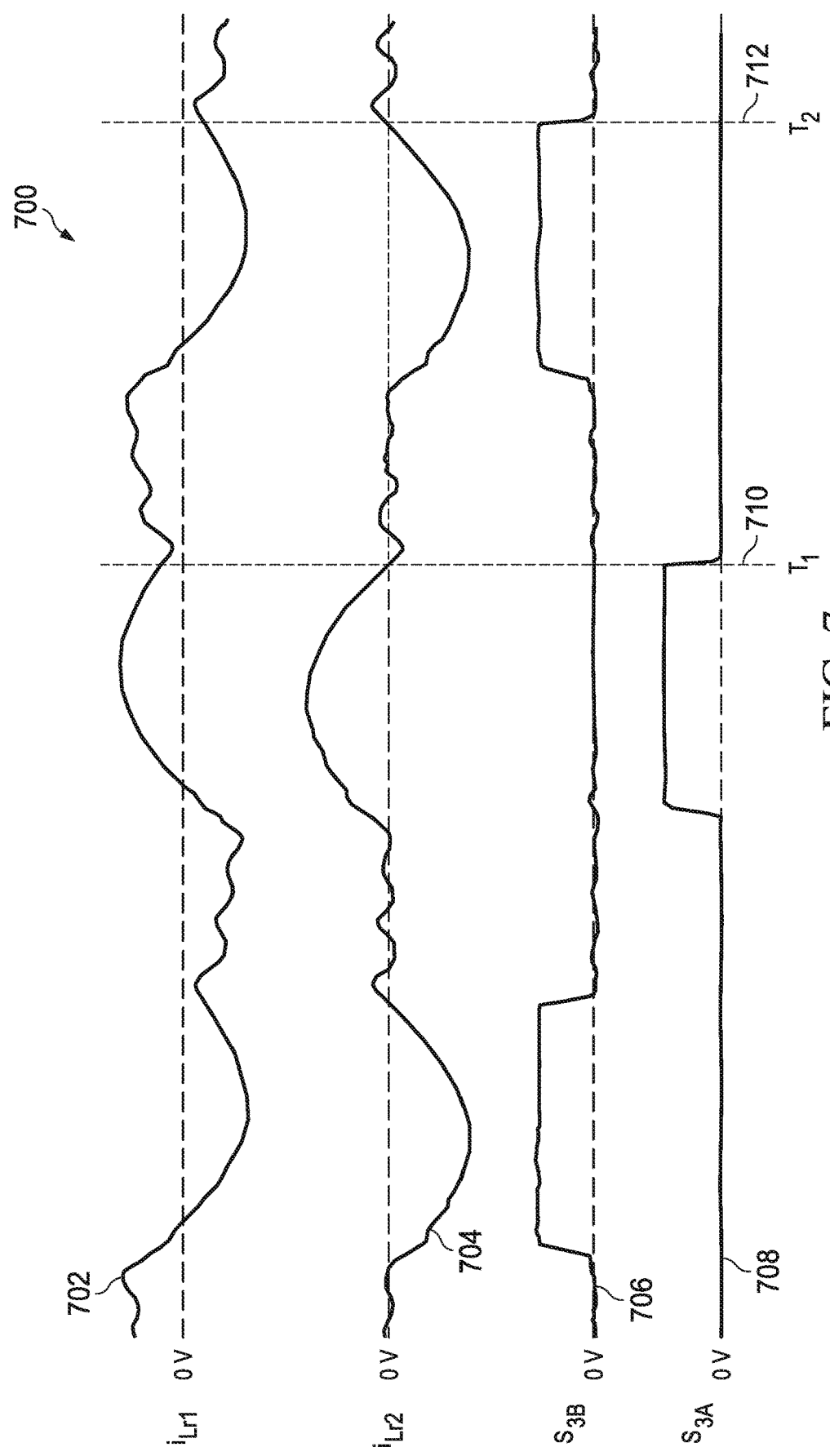
FIG. 7 is an example timing diagram including example waveforms associated with the example power converter of FIGS. 2 and/or 3.

FIG. 7 depicts an example timing diagram 700 including example waveforms 702, 704, 706, 708 associated with the power converter 210 of FIG. 2 and/or the power converter 302 of FIG. 3 at a first switching frequency. For example, the waveforms 702, 704, 706, 708 can be generated responsive to the power converter 210 of FIG. 2 and/or the power converter 302 operating at and/or otherwise having a switching frequency of 300 kHz. The waveforms 702, 704, 706, 708 include a first example waveform 702, a second example waveform 704, a third example waveform 706, and a fourth example waveform 708.

In this example, the first waveform 702 corresponds to first inductor current (iLr1) flowing through the first inductor 326 of FIG. 3. In this example, the second waveform 704 corresponds to second inductor current (iLr2) flowing through the second inductor 330 of FIG. 3. In this example, the third waveform 706 corresponds to the third control signal 354 of FIG. 3. For example, the third waveform 706 corresponds to a control signal of the fifth switch 336 of FIG. 3. In this example, the fourth waveform 708 corresponds to the fourth control signal 356 of FIG. 3. For example, the fourth waveform 708 corresponds to a control signal of the seventh switch 340 of FIG. 3. In such examples, the third waveform 706 and the fourth waveform 708 can be representative of control signals to effectuate SR control of the power converter 210 of FIG. 2 and/or the power converter 302 of FIG. 3.

In this example, the switching frequency (f$_{sw}$) is less than a resonant frequency (f$_{r1}$) of the power converter 210 of FIG. 2 and/or the power converter 302 of FIG. 3. At a first example time (T$_1$) 710, the fifth switch 336 is turned off. At the first time 710, the second inductor current meets and/or otherwise satisfies a zero-crossing threshold (e.g., approximately 0 V, 0 V, etc.). At a second example time (T$_2$) 712, the seventh switch 340 is turned off. At the second time 712, the first inductor current meets and/or otherwise satisfies a zero-crossing threshold (e.g., approximately 0 V, 0 V, etc.). Advantageously, the SR control logic 216 of FIGS. 2 and/or 3 implement optimized and/or otherwise improved SR turn-off timing and zero-current switching (ZCS) is achieved because the fifth switch 336 and the seventh switch 340 are turned off at approximately the same time as zero-crossing events of respective ones of the first inductor current and the second inductor current.

Figure 8:
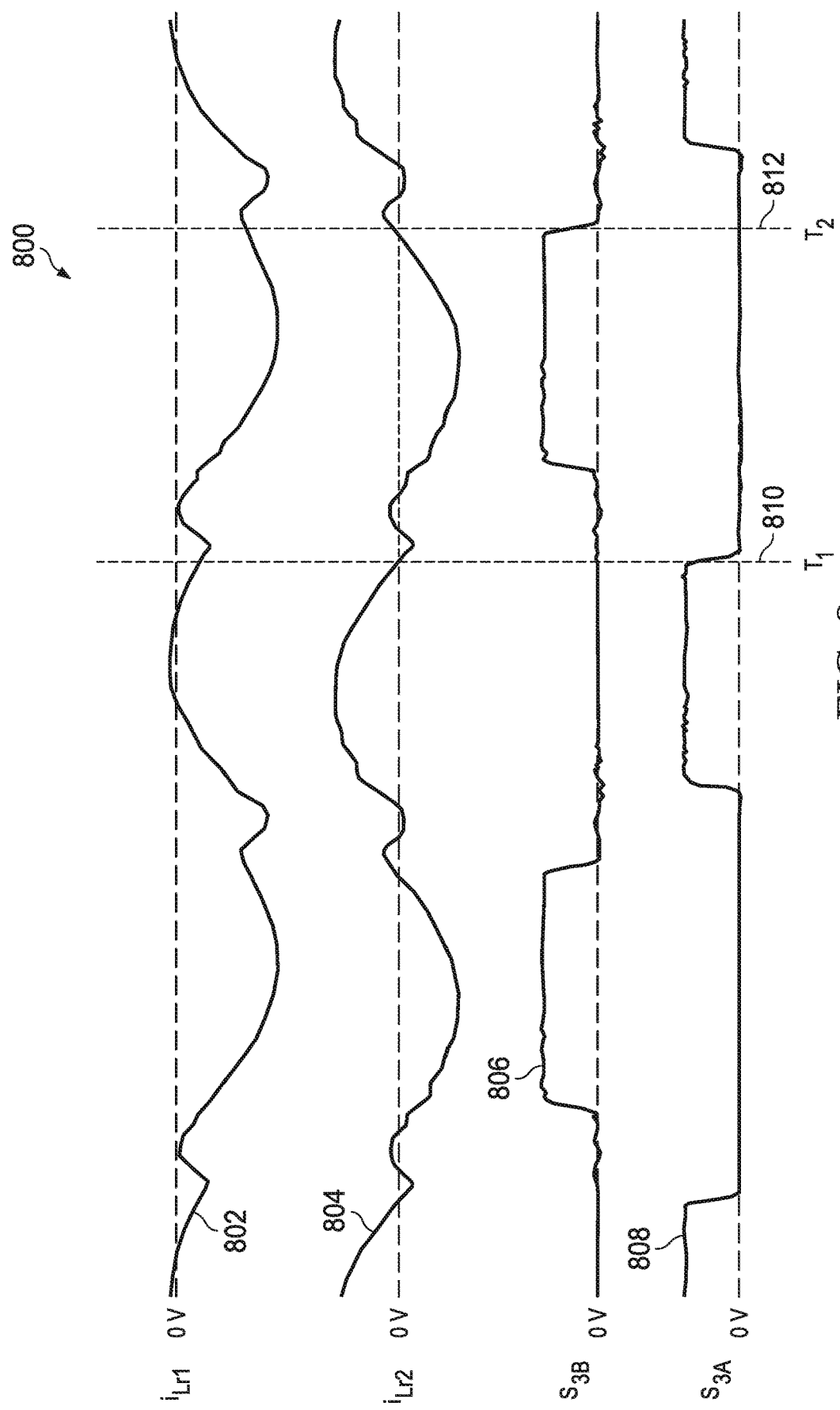
FIG. 8 is an example timing diagram including example waveforms associated with the example power converter of FIGS. 2 and/or 3.

FIG. 8 depicts an example timing diagram 800 including example waveforms 802, 804, 806, 808 associated with the power converter 210 of FIG. 2 and/or the power converter 302 of FIG. 3 at a second switching frequency. For example, the waveforms 802, 804, 806, 808 can be generated responsive to the power converter 210 of FIG. 2 and/or the power converter 302 operating at and/or otherwise having a switching frequency of 400 kHz. The waveforms 802, 804, 806, 808 include a first example waveform 802, a second example waveform 804, a third example waveform 806, and a fourth example waveform 808.

In this example, the first waveform 802 corresponds to first inductor current (iLr1) flowing through the first inductor 326 of FIG. 3. In this example, the second waveform 802 corresponds to second inductor current (iLr2) flowing through the second inductor 330 of FIG. 3. In this example, the third waveform 806 corresponds to the third control signal 354 of FIG. 3. For example, the third waveform 806 corresponds to a control signal of the fifth switch 336 of FIG. 3. In this example, the fourth waveform 808 corresponds to the fourth control signal 356 of FIG. 3. For example, the fourth waveform 808 corresponds to a control signal of the seventh switch 340 of FIG. 3. In such examples, the third waveform 806 and the fourth waveform 808 can be representative of control signals to effectuate SR control of the power converter 210 of FIG. 2 and/or the power converter 302 of FIG. 3.

In this example, the switching frequency (f$_{sw}$) is greater than the resonant frequency (f$_{r1}$) of the power converter 210 of FIG. 2 and/or the power converter 302 of FIG. 3. At a first example time (T$_1$) 810, the fifth switch 336 is turned off. At the first time 810, the second inductor current meets and/or otherwise satisfies a zero-crossing threshold (e.g., approximately 0 V, 0 V, etc.). At a second example time (T$_2$) 812, the seventh switch 340 is turned off. At the second time 812, the first inductor current meets and/or otherwise satisfies a zero-crossing threshold (e.g., approximately 0 V, 0 V, etc.). Advantageously, the SR control logic 216 of FIGS. 2 and/or 3 implement optimized and/or otherwise improved SR turn-off timing and zero-current switching (ZCS) is achieved because the fifth switch 336 and the seventh switch 340 are turned off at approximately the same time as zero-crossing events of respective ones of the first inductor current and the second inductor current.

FIG. 9A depicts an example timing diagram 900 associated with the power converter 210 of FIG. 2 and/or the power converter 302 of FIG. 3. The timing diagrams 900 include example waveforms 902, 904, 906, 908 including a first example waveform 902, a second example waveform 904, a third example waveform 906, and a fourth example waveform 908. Further depicted in the example of FIG. 9A is a first example timing diagram portion 920 that is enlarged in FIG. 9B and a second example timing diagram portion 922 that is enlarged in FIG. 9C for enhanced clarity.

In this example, the first waveform 902 and the second waveform 904 correspond to waveforms of transformer secondary winding current under different load conditions (e.g., a heavy load condition, a light load condition, etc.). In this example, the first waveform 902 corresponds to the transformer secondary winding current under a heavy load. For example, the first waveform 902 can correspond to a first current flowing through the secondary winding of the transformer 328 of FIG. 3 responsive to the power converter 302 under a heavy load and/or otherwise responsive to delivering a relatively high current to the load 304 of FIG. 3.

In this example, the second waveform 904 corresponds to the transformer secondary winding current under a light load. For example, the second waveform 904 can correspond to a second current flowing through the secondary winding of the transformer 328 of FIG. 3 responsive to the power converter 302 under a light load and/or otherwise responsive to delivering a relatively low current to the load 304 of FIG. 3.

In this example, the third waveform 906 and the fourth waveform 908 correspond to waveforms of output voltage from an integrator, such as the integrator logic 218 of FIGS. 2 and/or 3 under different load conditions. In this example, the third waveform 906 corresponds to the output voltage from the integrator logic 218 under a heavy load. For example, the third waveform 906 can correspond to a first output voltage generated by the integrator logic 218 responsive to the power converter 302 under a heavy load and/or otherwise responsive to delivering a relatively high current to the load 304 of FIG. 3. In this example, the first waveform 902 can correspond to the third waveform 906.

In this example, the fourth waveform 908 corresponds to the output voltage from the integrator logic 218 under a light load. For example, the fourth waveform 908 can correspond to a second output voltage generated by the integrator logic 218 responsive to the power converter 302 under a light load and/or otherwise responsive to delivering a relatively low current to the load 304 of FIG. 3. In this example, the second waveform 904 can correspond to the fourth waveform 908.

In the illustrated example of FIG. 9A, two level thresholds (e.g., $|V_{TH1}|$, $|V_{TH2}|$) are used to detect a slope of the integrator output voltage. For example, $V_{TH1}$ 909 can correspond to the first voltage threshold 446 of FIG. 4, $V_{TH2}$ 911 can correspond to the third voltage threshold 423 of FIG. 4, $-V_{TH1}$ 913 can correspond to the second voltage threshold 448 of FIG. 4, and $-V_{TH2}$ 2915 can correspond to the fourth voltage threshold 425 of FIG. 4.

The slope of the integrator output voltage corresponds to and/or otherwise represents a slope of the transformer winding current. In this example, $|V_{TH1}|$ (e.g., $V_{TH1}$ 909, $-V_{TH1}$ 913, etc.) is a fixed threshold and $|V_{TH2}|$ (e.g., $V_{TH2}$ 911, $V_{TH2}$ 915, etc.) is a threshold for PWM generation (e.g., signals generated by the PWM logic 416 of FIG. 4) that can be adaptively changed based on the detected slope (e.g., the slope of the integrator output voltage). Responsive to the slope detection, the slope detection logic 226, and/or, more generally, the SR control logic 216, adaptively changes $|V_{TH2}|$ to effectuate optimized and/or otherwise improved turn-off timing (e.g., SR turn-off timing).

At a first example time (T0) 910, the power converter 210 and/or the power converter 302 is in a positive switching cycle. At the first time 910, the third waveform 906 has a value greater than $V_{TH1}$ 909 and the fourth waveform 908 has a value that meets and/or otherwise satisfies $V_{TH1}$ 909. At a second example time ($T_1$) 912, the third waveform 906 has a value greater than $V_{TH1}$ 909 and the fourth waveform 908 has a value that meets and/or otherwise satisfies $V_{TH2}$ 911. At a third example time ($T_2$) 914, the third waveform 906 has a value that meets and/or otherwise satisfies $V_{TH1}$ 909 and the fourth waveform 908 has a value that is less than $V_{TH2}$ 911. At a fourth example time ($T_3$) 916, the third waveform 906 has a value that meets and/or otherwise satisfies $V_{TH2}$ 911 and the fourth waveform 908 has a value that is less than $V_{TH2}$ 911.

FIG. 9B depicts an enlargement of the first timing diagram portion 920 of FIG. 9A. In FIG. 9B, portions of the third waveform 906 and the fourth waveform 908 of FIG. 9A are depicted. In some examples, ideally SR PWM is tripped off at the fourth time 916 with a fixed propagation delay (e.g., $t_d = T_4 - T_3$) so that an SR FET (e.g., the fifth switch 336 of FIG. 3, the seventh switch 340 of FIG. 3, etc.) is turned off at the fifth time 918. For example, the slope determination logic 444 of the slope detection logic 226, and/or, more generally, the SR control logic 216 of FIGS. 2, 3, and/or 4, can determine $V_{TH2}$ 911 to be $V_2$ (as depicted in FIG. 9B) based on the example of Equation (9) below:

$$\left|\frac{dv(t)}{dt}\right|_{heavy\_load} = \frac{V_{TH1} - V_{TH2}}{T_3 - T_2},\quad \text{Equation (9)}$$

Responsive to determining $t_d$ and $$\frac{dv(t)}{dt},$$

me slope determination logic 444 of the slope detection logic 226, and/or, more generally, the SR control logic 216, can determine an integrator output voltage level when the SR FET is turned off as described below in Equation (10):

$$V_0 = V_{TH1} - \frac{V_{TH1} - V_{TH2}}{T_3 - T_2}t_d,\quad \text{Equation (10)}$$

Advantageously, by ensuring that the SR FET is also turned off when the integrator output voltage is at $V_0$ at a lighter load condition (e.g., a load condition with a lower $$\frac{di(t)}{dt}),$$

the slope determination logic 226, and/or, more generally, the SR control logic 216, can optimize and/or otherwise improve SR turn off across different load conditions. For example, at a lighter load, the slope determination logic 444 can determine, set, and/or otherwise assign $V_{TH1}$ 909 to be $V_1$ and $V_{TH2}$ 911 to be $V_2$ to determine $$\frac{dv(t)}{dt}.$$

Responsive to determining $$\frac{dv(t)}{dt},$$

the slope determination logic 226 can determine, set, and/or otherwise assign the new $V_{TH2}$ 911 to be $V_2'$ and trip the SR PWM at $V_2'$ in the next or upcoming switching cycle to optimize and/or otherwise improve SR FET turn off timing at the lighter load. The slope determination logic 444 of the slope detection logic 226 can determine $V_2'$ based on the examples of Equation (11) and Equation (12) below:

$$\left|\frac{dv(t)}{dt}\right|_{light\_load} = \frac{V_{TH1} - V_{TH2}}{T_1 - T_0},\quad \text{Equation (11)}$$

$$V_2' = V_0 + \frac{V_{th1} - V_{th2}}{t_1 - t_0}t_d,\quad \text{Equation (12)}$$

FIG. 9C depicts an enlargement of the second timing diagram portion 922 of FIG. 9A. FIG. 9C depicts portions of the first waveform 902, the second waveform 904, the third waveform 906, and the fourth waveform 908 of FIG. 9A. At a first example time ($T_{TH1'}$) 924, the fourth waveform 908 crosses, meets, and/or otherwise satisfies $V_{TH1}$ 909. For example, the first time 924 of FIG. 9C can correspond to the first time 910 of FIG. 9A. At a second example time ($T_{TH2'}$) 926, the fourth waveform 908 crosses, meets, and/or otherwise satisfies $V_{TH2}$ 911. For example, the second time 926 of FIG. 9C can correspond to the second time 912 of FIG. 9A. At a third example time ($T_{TH1}$) 928, the third waveform 906 crosses, meets, and/or otherwise satisfies $V_{TH1}$ 909. For example, the third time 928 of FIG. 9C can correspond to the third time 914 of FIG. 9A. At a fourth example time ($T_{TH2}$) 930, the third waveform 906 crosses, meets, and/or otherwise satisfies $V_{TH2}$ 911. For example, the fourth time 930 of FIG. 9C can correspond to the fourth time 916 of FIG. 9A.

In the illustrated example of FIG. 9C, at a heavy load, winding current zero crossing at a fifth example time ($T_{ZC}$) 932 is desired for SR to be turned off. $V_{ZC}$ 944 corresponds to a voltage at which the first waveform 902 crosses a zero-voltage threshold. $V_{ZC}$ 944 depicted in FIG. 9C is less than the integrator output voltage midpoint $V_0$ 948. This is due to the phase difference crated by the integrator logic 218 of FIGS. 2, 3, and/or 4 and the timing difference ($T_{ZC}-T_0$). The SR determination logic 226, and/or, more generally, the SR control logic 216, can determine the timing difference by determining Φ described above in connection with Equation (4), Equation (5), and/or Equation (6). In such examples, $T_0$ 934 is the time at which the integrator output voltage drops to $V_0$ 948. In addition to the integrator phase difference, the propagation delay ($t_d$) is expected in the power conversion system 300. In some such examples, the slope determination logic 444 can determine, set, and/or otherwise assign |$V_{TH2}$| to be higher than $V_{ZC}$ 944 to take the integrator phase difference and the propagation delay into account.

In some examples, to turn off SR at the winding current zero crossing at a heavy load (e.g., a change from a light load to a heavy load), the |$V_{TH2}$| level is set by the slope determination logic 226 based on Equation (7) above. For example, the slope determination logic 226 can determine |$V_{TH2,n+1}$| in the example of Equation (7) above to be $V_{TH2,NEW}$ 936 in FIG. 9C. In such examples, the time at which the fourth waveform 908 crosses, meets, and/or otherwise satisfies $V_{TH2,NEW}$ 936 is $T_{TH2,NEW}$ 938.

In some examples, to turn off SR at the winding current zero crossing at a light load (e.g., a change from a heavy load to a light load), the slope detection logic 226 adjusts the winding current zero crossing and the integrator output midpoint timing to $T_{ZC'}$ 940 and $T_0'$ 942, respectively. A voltage $V_{ZC'}$ 946 corresponds to a voltage at which the second waveform 904 crosses and/or meets a zero voltage threshold. In such examples, the slope detection logic 226 determines the adjusted and/or otherwise optimized |$V_{TH2}$| threshold level at the light load based on the example of Equation (8) above.

Figure 10:
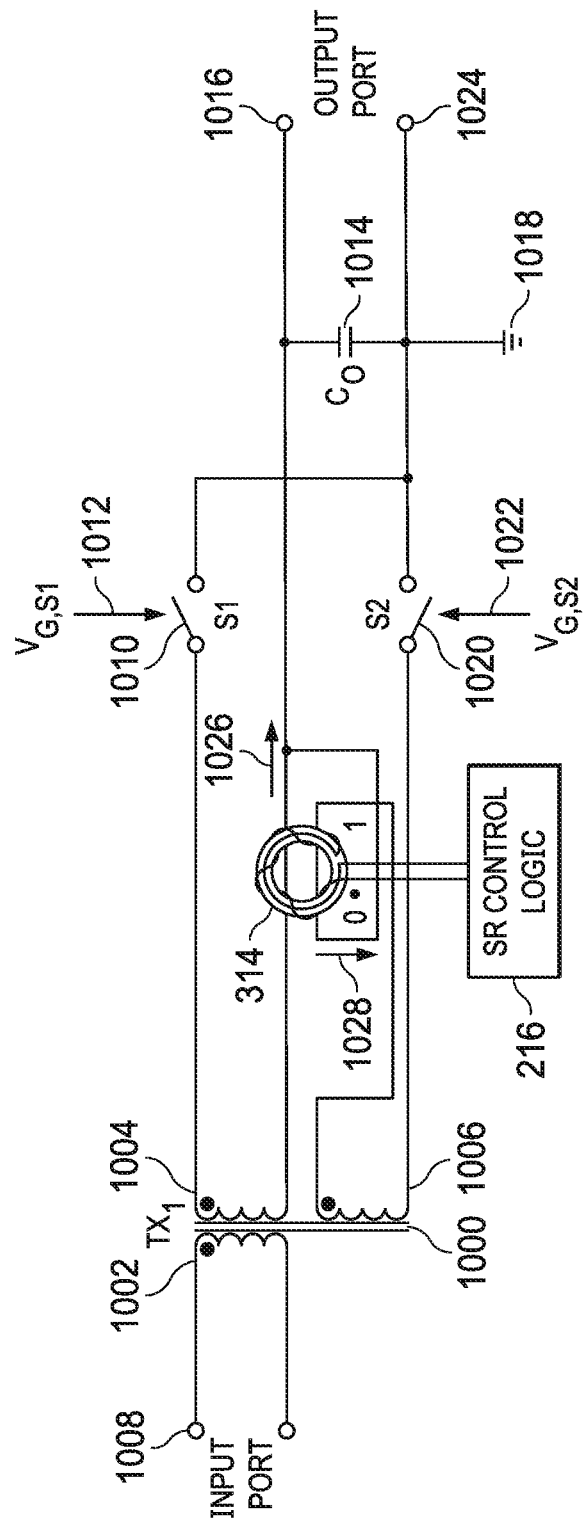
FIG. 10 is a schematic illustration of an example transformer including a primary winding and secondary windings and an example Rogowski coil arranged around a current path of the secondary windings.

FIG. 10 is a schematic illustration of an example transformer ($TX_1$) 1000 including a primary winding 1002, a first secondary winding 1004, and a second secondary winding 1006. Terminals of the primary winding 1002 are coupled to respective example input ports 1008.

A first terminal of the first secondary winding 1004 is coupled to a first example switch (S1) 1010, which is controlled by a first example gate voltage ($V_{G\_S1}$) 1012. A second terminal of the first secondary winding 1004 is coupled to a first terminal of an example capacitor ($C_O$) 1014 and a first example output port 1016. A second terminal of the capacitor 1014 is coupled to an example reference voltage terminal 1018.

A first terminal of the second secondary winding 1006 is coupled to the second terminal of the first secondary winding 1004, to the first terminal of the capacitor 1014, and to the first output port 1016. A second terminal of the second secondary winding 1006 is coupled to a second example switch (S2) 1020, which is controlled by a second example gate voltage ($V_{G\_S2}$) 1022. The second switch 1020 is coupled to the first switch 1010 and to a second example output port 1024.

Further depicted in FIG. 10 is the Rogowski coil 314 of FIG. 3 arranged around a first current path of the second terminal of the first secondary winding 1004 and a second current path of the first terminal of the second secondary winding 1006. The first current path has a first example current direction (e.g., a first conventional current direction) depicted with arrow 1026. The second current path has a second example current direction (e.g., a second conventional current direction) depicted with arrow 1028. In this example, output terminals (e.g., output terminal 0, output terminal 1, etc.) of the Rogowski coil 314 are coupled to input terminals of the SR control logic 216 of FIGS. 2, 3, and/or 4. For example, the output terminals of the Rogowski coil 314 can be coupled to the input terminals of the SR logic 216 as depicted in the examples of FIGS. 3 and/or 4. Advantageously, the Rogowski coil 314 and/or the SR control logic 216 can effectuate optimized and/or otherwise improved SR control of power converters, such as the power converter 104 of FIG. 1, the power converter 210 of FIG. 2, and/or the power converter 302 of FIG. 3, using any arrangement, configuration, and/or quantity of transformer windings (e.g., one or more transformer secondary output windings).

Figure 11A:
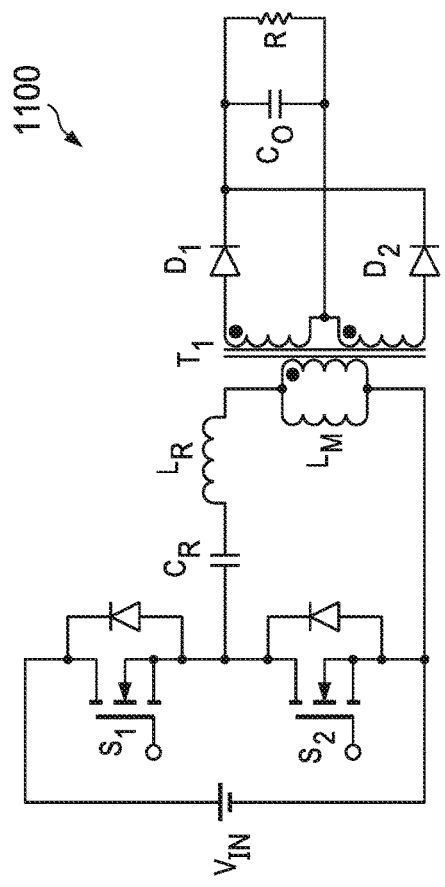
FIG. 11A is a schematic illustration of an example inductor-inductor-capacitor (LLC) series resonant converter.
Figure 11B:
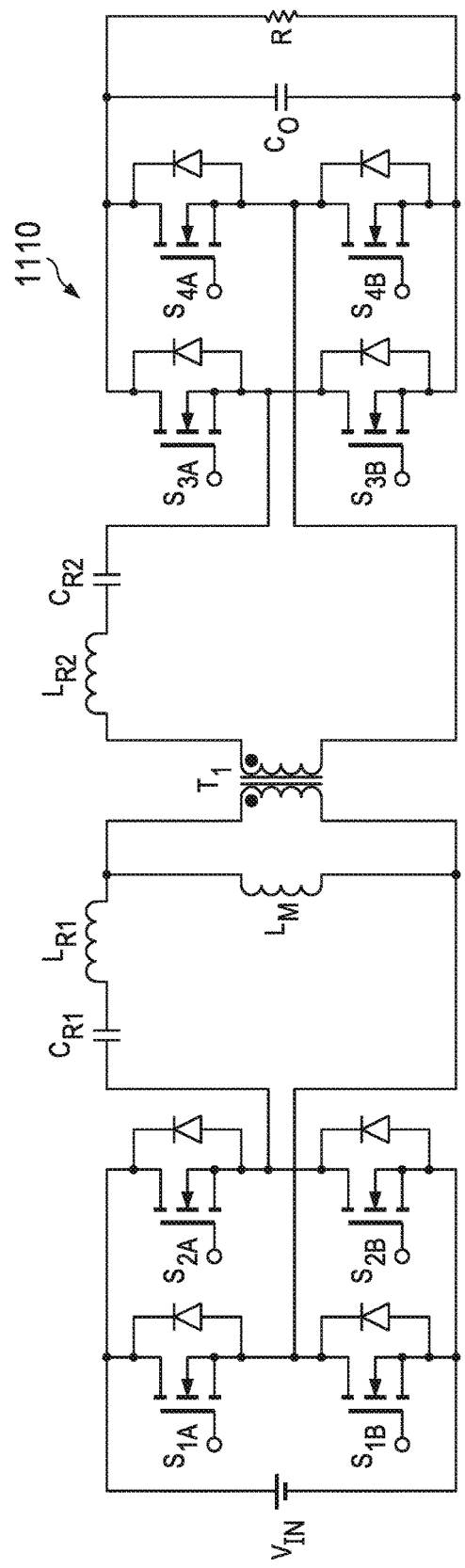
FIG. 11B is a schematic illustration of an example capacitor-inductor-inductor-inductor-capacitor (CLLLC) bi-directional resonant converter.
Figure 11C:
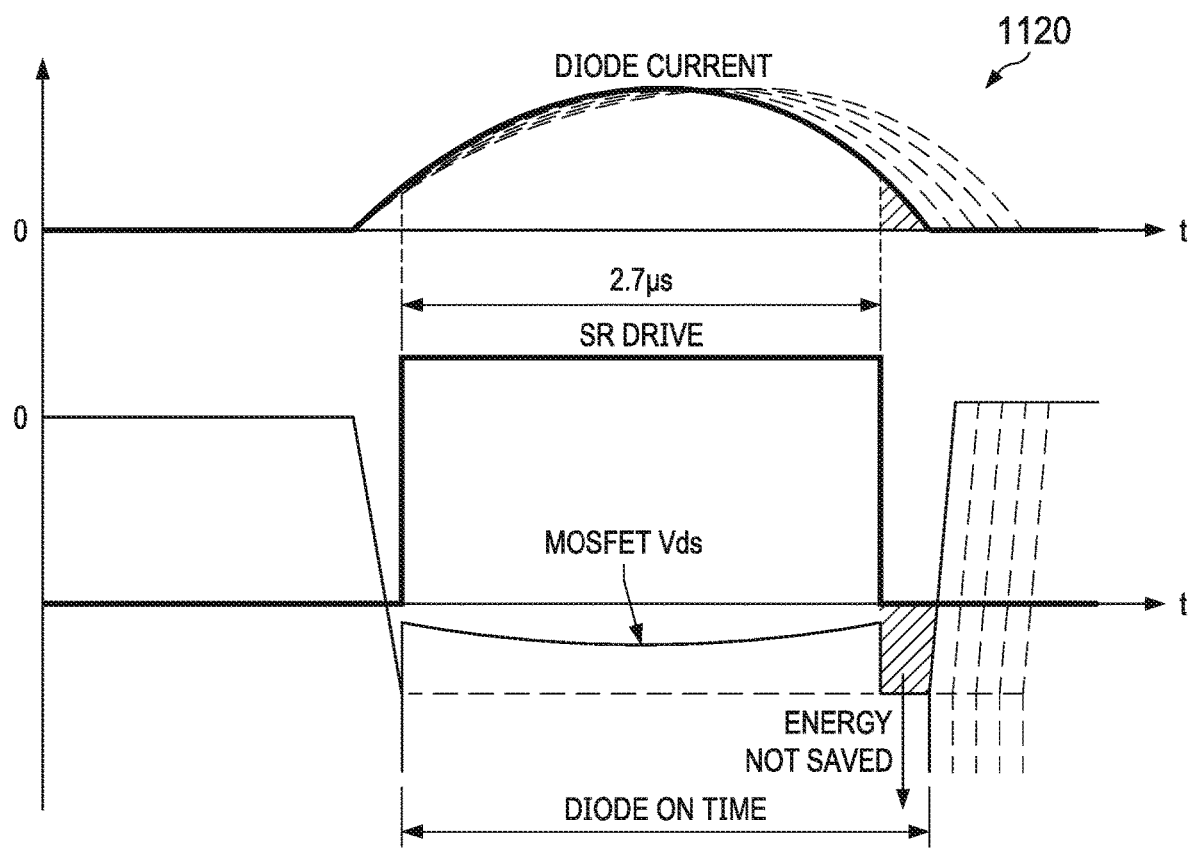
FIG. 11C is a first example timing diagram associated with the LLC series resonant converter of FIG. 11A.
Figure 11D:
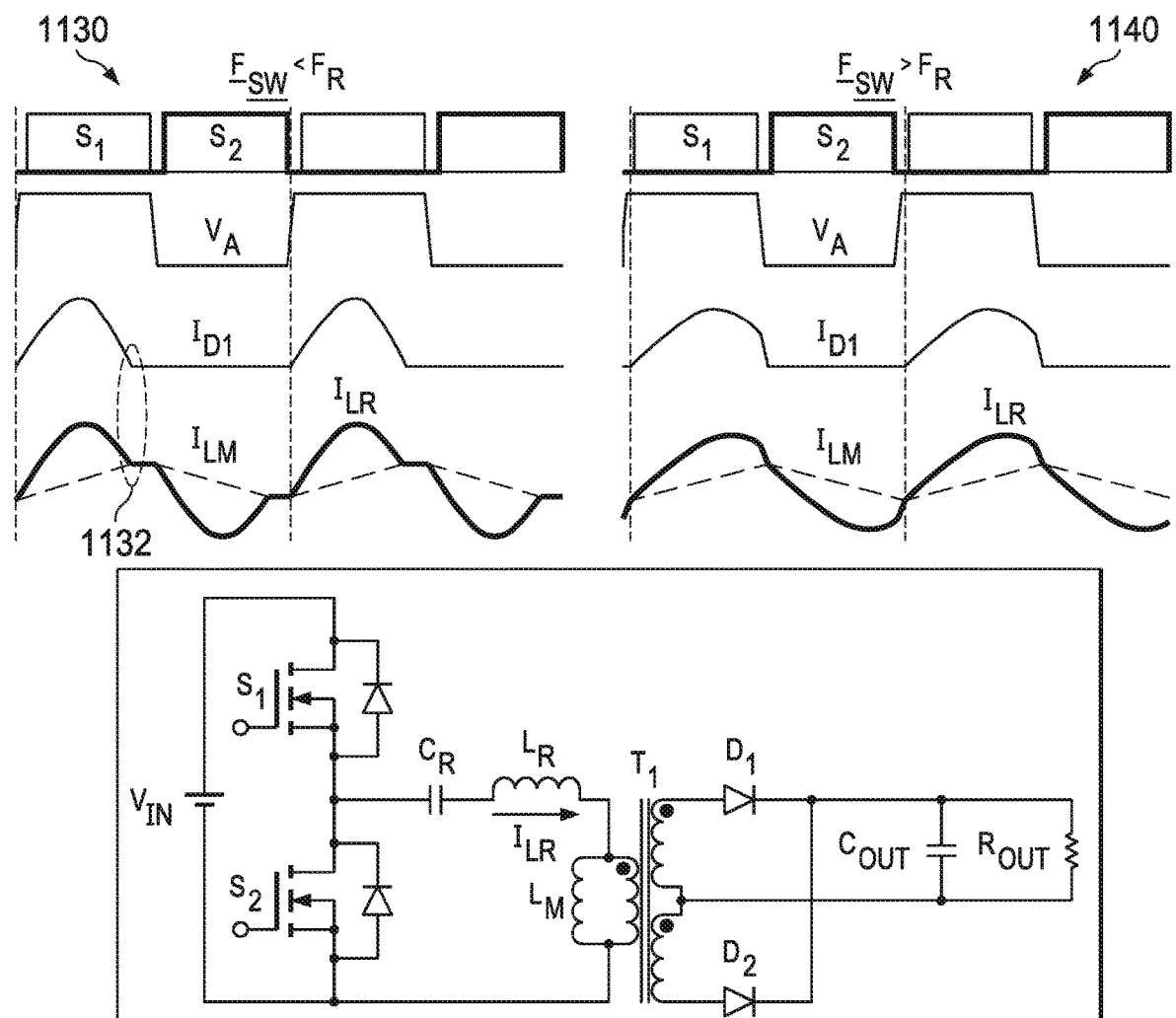
FIG. 11D depicts second example timing diagrams associated with the LLC series resonant converter of FIG. 11A.

FIG. 11A is a schematic illustration of an example inductor-inductor-capacitor (LLC) series resonant converter 1100. FIG. 11B is a schematic illustration of an example capacitor-inductor-inductor-inductor-capacitor (CLLLC) bi-directional resonant converter 1110. FIG. 11C depicts a first example timing diagram 1120 associated with the LLC series resonant converter 1100 of FIG. 11A. FIG. 11D depicts second example timing diagrams 1130 associated with the LLC series resonant converter 1100 of FIG. 11A.

For high-power density applications, challenges exist between operating such converters at high-switching frequency while also maintaining low conduction loss on the circuit switches (e.g., $S_1$ and $S_2$ of the LLC series resonant converter 1100, $S_{1A}$, $S_{1B}$, $S_{2A}$, $S_{2B}$, $S_{3A}$, $S_{3B}$, $S_{4A}$, and $S_{4B}$ of the CLLLC bi-directional resonant converter 1110, etc.). Advantageously, the SR control logic 216 of FIGS. 2, 3, and/or 4 can effectuate operation of such converters at high-switching frequency while also maintaining low conduction loss on the control switches. Advantageously, the SR control logic 216 can avoid and/or otherwise prevent high conduction losses with SR control of the LLC series resonant converter 1100, the CLLLC bi-directional resonant converter 1110, etc., as described herein. For example, when a rectifier of the LLC series resonant converter 1100 is switched off while the rectifier is still conducting current, then current will flow through a body diode of the rectifier and can result in high conduction losses, an example of which is shown in FIG. 11C.

FIG. 11D depicts a first example timing diagram 1130 and a second example timing diagram 1140 corresponding to operation of the LLC series resonant converter 1100 of FIG. 11A. The first timing diagram 1130 depicts an example of how, when the switching frequency ($F_{SW}$) is less than the resonant frequency ($F_R$), the rectifier current shuts off before the switching transient, which is depicted with an encircled portion 1132. The second timing diagram 1140 depicts an example of how, when the switching frequency ($F_{SW}$) is greater than the resonant frequency ($F_R$), the rectifier current shuts off after the switching transient. Advantageously, the SR control logic 216 of FIGS. 2, 3, and/or 4 is an improvement over the LLC series resonant converter 1100 of FIG.

11A and/or the CLLLC bi-directional series resonant converter 1110 of FIG. 11B because the SR control logic 216 can improve and/or otherwise optimize rectifier current shut off at switching frequencies less than or greater than the resonant frequency.

Figure 12A:
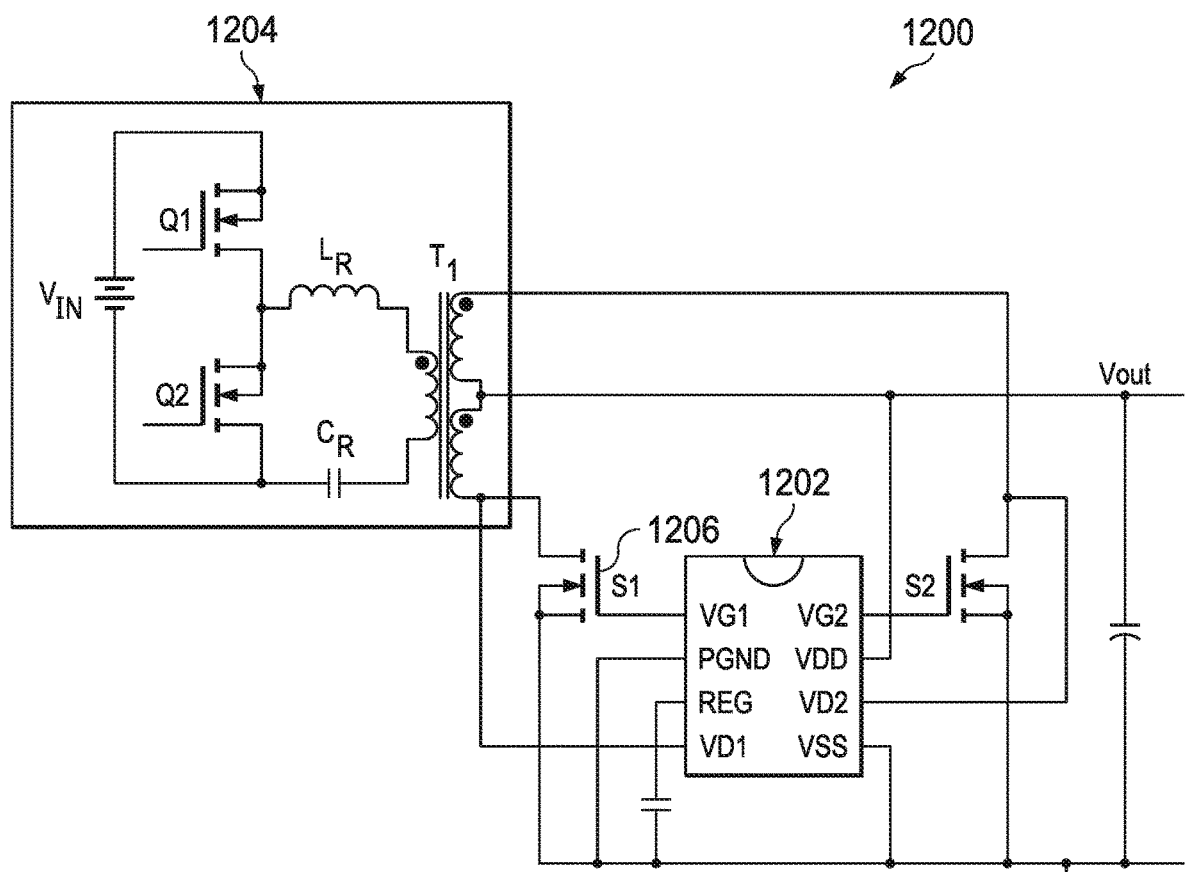
FIG. 12A is a schematic illustration of another example power conversion system including another example LLC series resonant converter and an example SR controller.

FIG. 12A depicts an example power conversion system 1200 including an example SR controller 1202 in circuit with an example LLC resonant converter 1204. The SR controller 1202 uses drain-to-source ($V_{DS}$) voltage sensing techniques for on and off control of the SR MOSFET (S1) 1206. Advantageously, the SR control logic 216 of FIGS. 2, 3, and/or 4 is an improvement over $V_{DS}$ sensing techniques for resonant converters, such as the LLC resonant converter 1204, because the SR control logic 216 is not limited by a $V_{DS}$ sensing voltage rating (e.g., less than 200 V peak, 300 V peak, etc.) of an IC, such as the SR controller 1202.

Figure 12B:
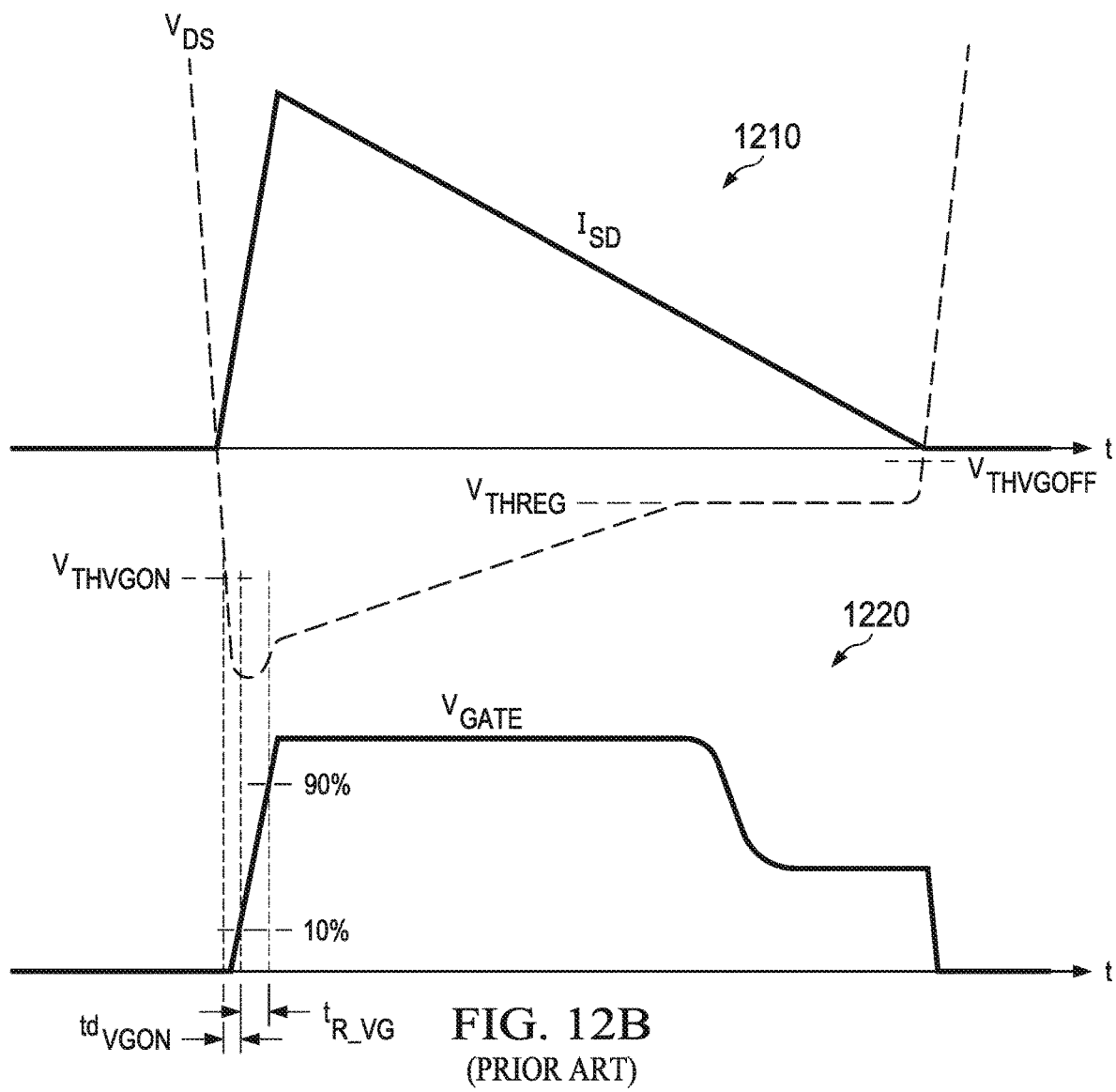
FIG. 12B depicts example timing diagrams associated with the example power conversion system of FIG. 12A.

FIG. 12B depicts example waveforms 1210, 1220 corresponding to operation of the power conversion system 1200 of FIG. 12A. The waveforms 1210, 1220 include a first example waveform 1210 and a second example waveform 1220. The first waveform 1210 corresponds to drain-to-source current ($I_{DS}$) (e.g., $I_{DS}$ of the SR MOSFET 1206 of FIG. 12A) with respect to time. The second waveform 1220 corresponds to a gate voltage ($V_{GATE}$) (e.g., $V_{GATE}$ of the SR MOSFET 1206) with respect to time. As depicted in the example of FIG. 12B, operation of the SR MOSFET 1206 is limited to the SR FET $V_{DS}$ voltage. Advantageously, the SR control logic 216 is an improvement over $V_{DS}$ sensing techniques because the SR control logic 216 is not limited by SR FET $V_{DS}$ voltage as depicted in the waveforms 1210, 1220 of FIG. 12B.

FIG. 12C depicts example waveforms 1230, 1240 corresponding to operation of the power conversion system 1200 of FIG. 12A. The waveforms 1230, 1240 include a first example waveform 1230 and a second example waveform 1240. The first waveform 1230 corresponds to a frequency response of the SR controller 1202 of FIG. 12A. The second waveform 1240 corresponds to a phase response of the SR controller 1202. Advantageously, the SR control logic 216 is an improvement over $V_{DS}$ sensing techniques because the SR control logic 216 is not limited by switching frequency as depicted in the waveforms 1230, 1240 of FIG. 12C.

Figure 13:
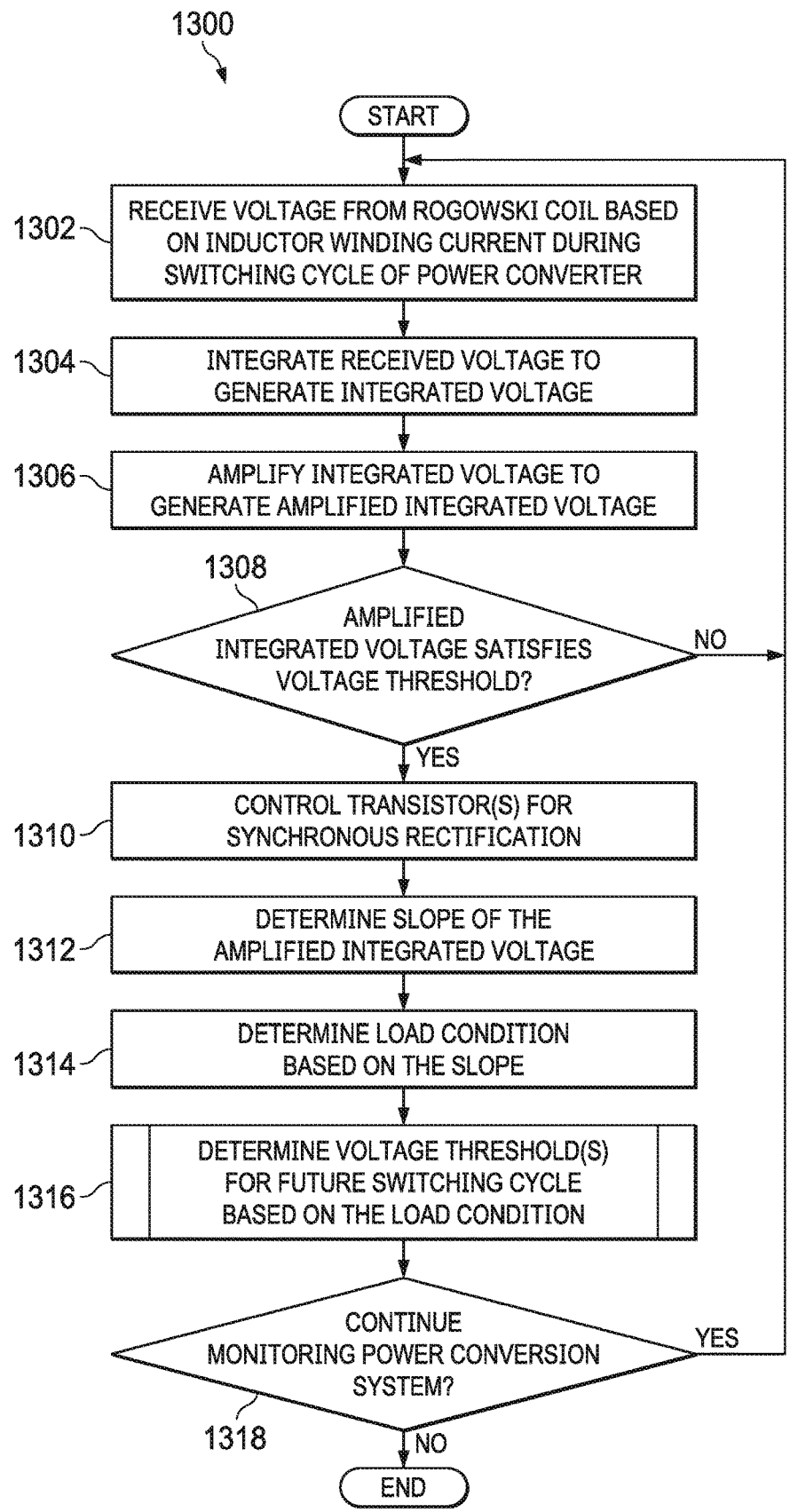
FIG. 13 is a flowchart representative of an example process that may be carried out while utilizing machine readable instructions that can be executed and/or hardware configured to implement the example SR control logic of FIGS. 2, 3, and/or 4 to control an example transistor based on outputs from an example Rogowski coil.
Figure 14:
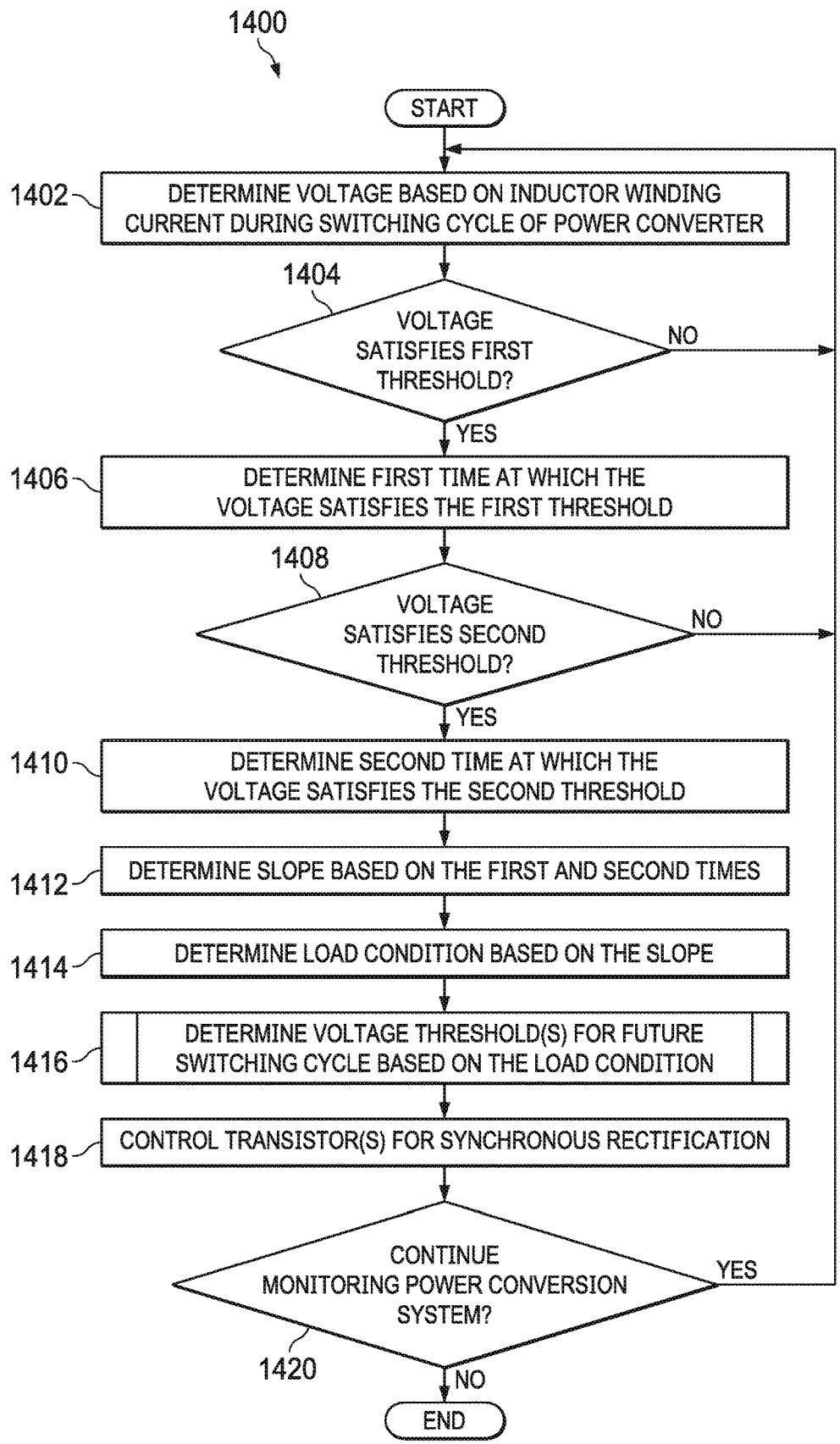
FIG. 14 is a flowchart representative of another example process that may be carried out while utilizing machine readable instructions that can be executed and/or hardware configured to implement the example SR control logic of FIGS. 2, 3, and/or 4 to control an example transistor based on outputs from an example Rogowski coil.
Figure 15:
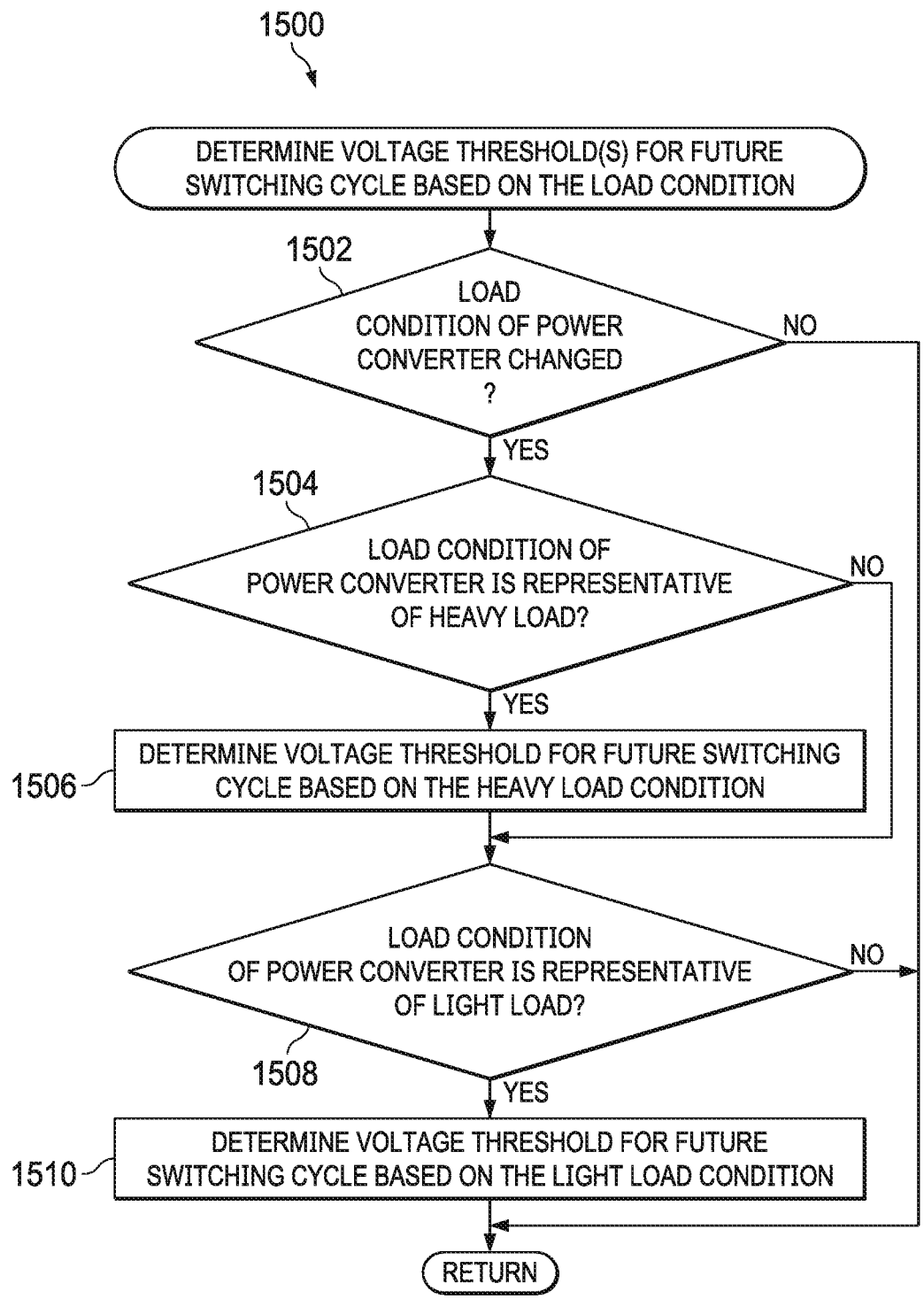
FIG. 15 is a flowchart representative of an example process that may be carried out while utilizing machine readable instructions that can be executed and/or hardware configured to implement the example SR control logic FIGS. 2, 3, and/or 4 to determine voltage threshold(s) based on a load condition of the example power converter of FIGS. 1, 2, and/or 3.

Flowcharts representative of an example process that may be carried out while utilizing example hardware logic, example machine readable instructions (e.g., hardware readable instructions), example hardware implemented state machines, and/or any combination thereof configured to implement the example SR control logic of FIGS. 2, 3, 4, and/or 10 are shown in FIGS. 13-15. The example machine readable instructions may be one or more executable programs or portion(s) of an executable program for execution by programmable processor(s), programmable controller(s), GPU(s), DSP(s), ASIC(s), PLD(s), and/or FPLD(s). The program may be embodied in software stored on a non-transitory computer readable storage medium such as a non-volatile memory, volatile memory, etc., but the entire program and/or parts thereof could alternatively be executed by any other device (e.g., programmable device) and/or embodied in firmware or dedicated hardware. Further, although the example program is described with reference to the flowcharts illustrated in FIGS. 13-15, many other methods of implementing the example SR control logic 216 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices. The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

The machine readable instructions described herein can be represented by any past, present, or future instruction language, scripting language, programming language, etc. For example, the machine readable instructions may be represented using any of the following languages: assembly language, C, C++, Java, C#, Perl, Python, JavaScript, HyperText Markup Language (HTML), Structured Query Language (SQL), Swift, etc.

As mentioned above, the example processes of FIGS. 13-15 may be implemented using executable instructions (e.g., computer, machine, and/or hardware readable instructions) stored on a non-transitory computer and/or machine readable medium such as a flash memory, a read-only memory, a a cache, a random-access memory, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory machine readable medium, and/or non-transitory hardware readable medium is/are expressly defined to include any type of computer, machine, and/or hardware readable storage device and/or storage disk and to exclude propagating signals and to exclude transmission media.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

FIG. 13 is a flowchart representative of an example process 1300 that may be carried out while utilizing machine readable instructions that can be executed and/or hardware configured to implement the example SR control logic 216 of FIGS. 2, 3, 4, and/or 10 to control an example transistor (e.g., the fifth switch 336, the seventh switch 340, etc.) based on outputs from an example Rogowski coil, such as the Rogowski coil 100 of FIG. 1, the coil 214 of FIG. 2, and/or the Rogowski coil 314 of FIG. 3. The example process 1300 begins at block 1302, at which the SR control logic 216 receives a voltage from a Rogowski coil based on inductor winding current during a switching cycle of a power converter. For example, the integrator logic 218 (FIG. 2) can receive an output voltage from the Rogowski coil 314 (FIG. 3). The output voltage is based on the time-varying current 348 generated by the power converter 302 during a switching cycle.

At block 1304, the SR control logic 216 integrates the received voltage to generate an integrated voltage. For example, responsive to receiving the output voltage from the Rogowski coil 314, the integrator logic 218 (FIG. 2), can generate an integrated voltage based on the output voltage.

At block 1306, the SR control logic 216 amplifies the integrated voltage to generate an amplified integrated voltage. For example, responsive to generating the integrated voltage, the gain amplifier logic 220 (FIG. 2) can amplify the integrated voltage to generate an amplified integrated voltage.

At block 1308, the SR control logic 216 determines whether the amplified integrated voltage satisfies a voltage threshold. For example, the first comparator 418 (FIG. 4) or the second comparator 420 (FIG. 4) can compare the amplified integrated voltage to a respective one of the third voltage threshold 423 (FIG. 4) or the fourth voltage threshold 425 (FIG. 4). If, at block 1308, the SR control logic 216 determines that the voltage does not satisfy the voltage threshold, control returns to block 1302 to receive another voltage from the Rogowski coil based on the inductor winding current during the switching cycle of the power converter. If, at block 1308, the SR control logic 216 determines that the amplified integrated voltage satisfies the voltage threshold, then, at block 1310, the SR control logic 216 control(s) transistor(s) for synchronous rectification. For example, responsive to receiving the first trip event signal 454 of FIG. 4 or the second trip event signal 456 of FIG. 4, the PWM logic 230 generates one(s) of the control signal(s) 350, 352, 354, 356 of FIG. 3 to control one(s) of the switches 336, 338, 340, 342 of FIG. 3 to effectuate SR control of the power converter 302.

At block 1312, the SR control logic 216 determines a slope of the amplified integrated voltage. For example, the slope determination logic 444 (FIG. 4) can determine the slope based on a ratio of (i) a first difference between the first voltage threshold 446 and the third voltage threshold 450 and (ii) a second difference between the third time 914 and the fourth time 916 (e.g., a first counter value that corresponds to the third time 914 and a second counter value that corresponds to the fourth time 916). In such examples, the slope determination logic 444 can determine the slope based on the example of Equation (9) above or the example of Equation (11) above.

At block 1314, the SR control logic 216 determines a load condition based on the slope. For example, the slope determination logic 444 can determine that the power converter 302 is operating under a heavy load, a light load, or any other load condition based on the slope.

At block 1316, the SR control logic 216 determines voltage threshold(s) for future switching cycle based on the load condition. For example, the slope determination logic 444 can determine and/or otherwise output an adjustment to the third voltage threshold 423 and/or the fourth voltage threshold 425 of FIG. 4 based on at least one of the slope or the load condition. In such examples, during the future switching cycle, the SR control logic 216 can determine at block 1308 whether the amplified integrated voltage during the future switching cycle satisfies an adjusted one of the third voltage threshold 423 and/or the fourth voltage threshold 425. An example process that may be executed to implement block 136 is described below in connection with FIG. 15.

At block 1318, the SR control logic 216 determines whether to continue monitoring the power conversion system. For example, the integrator logic 218, and/or, more generally, the SR control logic 216, can determine whether another voltage is received from the output terminals of the Rogowski coil 314 of the power conversion system 300. If, at block 1318, the SR control logic 216 determines to continue monitoring the power conversion system 300 of FIG. 3, control returns to block 1302 to determine another voltage based on the inductor winding current during the switching cycle of the power converter. If, at block 1318, the SR control logic 216 determines not to continue monitoring the power conversion system 300 of FIG. 3, the example process 1300 of FIG. 13 concludes.

FIG. 14 is a flowchart representative of an example process 1400 that may be carried out while utilizing machine readable instructions that can be executed and/or hardware configured to implement the example SR control logic 216 of FIGS. 2, 3, 4, and/or 10 to control an example transistor (e.g., the fifth switch 336, the seventh switch 340, etc.) based on outputs from an example Rogowski coil. The example process 1400 begins at block 1402, at which the SR control logic 216 determines a voltage based on inductor winding current during a switching cycle of a power converter. For example, the integrator logic 218 (FIG. 2) can receive an output voltage from the Rogowski coil 314 (FIG. 3). The output voltage is based on the time-varying current 348 generated by the power converter 302 during a switching cycle. Responsive to receiving the output voltage, the integrator logic 218 can generate an integrated voltage based on the output voltage. Responsive to generating the integrated voltage, the gain amplifier logic 220 (FIG. 2) can amplify the integrated voltage to generate an amplified integrated voltage.

At block 1404, the SR control logic 216 determines whether the voltage satisfies a first threshold. For example, the third comparator 428 (FIG. 4) of the slope detection logic 226 (FIG. 2) can determine whether the amplified integrated voltage (e.g., a first value of the amplified integrated voltage) satisfies the first voltage threshold 446.

If, at block 1404, the SR control logic 216 determines that the voltage does not satisfy the first threshold, control returns to block 1402 to determine another voltage based on the inductor winding current during the switching cycle of the power converter. If, at block 1404, the SR control logic 216 determines that the voltage satisfies the first threshold, then, at block 1406, the SR control logic 216 determines a first time at which the voltage satisfies the first threshold. For example, the slope determination logic 444 (FIG. 4) can determine that the amplified integrated voltage satisfies the first voltage threshold 446 at the third time 914 (FIG. 9). In such examples, the third time 914 can be a timestamp, a value of a hardware counter, etc.

At block 1408, the SR control logic 216 determines whether the voltage satisfies a second threshold. For example, the fourth comparator 430 (FIG. 4) of the slope detection logic 226 can determine whether the amplified integrated voltage (e.g., a second value of the amplified integrated voltage) satisfies the third voltage threshold 423.

If, at block 1408, the SR control logic 216 determines that the voltage does not satisfy the second threshold, control returns to block 1402 to determine another voltage based on the inductor winding current during the switching cycle of the power converter. If, at block 1408, the SR control logic 216 determines that the voltage satisfies the second threshold, then, at block 1410, the SR control logic 216 determines a second time at which the voltage satisfies the second threshold. For example, the slope determination logic 444 can determine that the amplified integrated voltage satisfies the second voltage threshold 448 at the fourth time 916 (FIG. 9). In such examples, the fourth time 916 can be a timestamp, a value of a hardware counter, etc.

At block 1412, the SR control logic 216 determines a slope based on the first and second times. For example, the slope determination logic 444 can determine the slope based on a ratio of (i) a first difference between the first voltage threshold 446 and the third voltage threshold 423 and (ii) a second difference between the third time 914 and the fourth time 916. In such examples, the slope determination logic 444 can determine the slope based on the example of Equation (9) above or the example of Equation (11) above.

At block 1414, the SR control logic 216 determines a load condition based on the slope. For example, the slope determination logic 444 can determine that the power converter 302 is operating under a heavy load, a light load, or any other load condition based on the slope.

At block 1416, the SR control logic 216 determines voltage threshold(s) for future switching cycle based on the load condition. For example, the slope determination logic 444 can determine and/or otherwise output the third voltage threshold 423 and/or the fourth voltage threshold 425 of FIG. 4 based on at least one of the slope or the load condition. An example process that may be executed to implement block 1416 is described below in connection with FIG. 15.

At block 1418, the SR control logic 216 control(s) transistor(s) for synchronous rectification. For example, responsive to receiving the first trip event signal 454 of FIG. 4 or the second trip event signal 456 of FIG. 4, the PWM logic 230 (FIG. 2) generates one(s) of the control signal(s) 350, 352, 354, 356 of FIG. 3 to control one(s) of the switches 336, 338, 340, 342 of FIG. 3 to effectuate SR control of the power converter 302.

At block 1422, the SR control logic 216 determines whether to continue monitoring the power conversion system. For example, the integrator logic 218, the gain amplifier logic 220, the switch control logic 222, and/or, more generally, the SR control logic 216, can determine whether another voltage is received from the output terminals of the Rogowski coil 314 of the power conversion system 300. If, at block 1422, the SR control logic 216 determines to continue monitoring the power conversion system 300 of FIG. 3, control returns to block 1402 to determine another voltage based on the inductor winding current during the switching cycle of the power converter. If, at block 1422, the SR control logic 216 determines not to continue monitoring the power conversion system 300 of FIG. 3, the example process 1400 of FIG. 14 concludes.

FIG. 15 is a flowchart representative of an example process 1500 that may be carried out while utilizing machine readable instructions that can be executed and/or hardware configured to implement the SR control logic 216 of FIGS. 2, 3, 4, and/or 10 to determine voltage threshold(s) based on a load condition of the power converter 104 of FIG. 1, the power converter 210 of FIG. 2, and/or the power converter 302 of FIG. 3. The example process 1500 begins at block 1502, at which the SR control logic 216 determines whether a load condition of the power converter has changed. For example, the slope determination logic 444 (FIG. 4) can determine that the load condition of the power converter 302 has changed from a heavy load to a light load, a light load to a heavy load, etc., based on the slope.

If, at block 1502, the SR control logic 216 determines that the load condition of the power converter has not changed, the example process 1500 concludes. For example, control can return to block 1318 of the example process 1300 of FIG. 13 or to block 1418 of the example process of FIG. 14. If, at block 1502, the SR control logic 216 determines that the load condition of the power converter has changed, then, at block 1504, the SR control logic 216 determines whether the load condition of the power converter is representative of a heavy load. For example, the slope determination logic 444 can determine that the load condition is a heavy load based on the slope.

If, at block 1504, the SR control logic 216 determines that the load condition of the power converter is not representative of a heavy load, control proceeds to block 1508 to determine whether the load condition of the power converter is representative of a light load. If, at block 1504, the SR control logic 216 determines that the load condition of the power converter is representative of a heavy load, then, at block 1506, the SR control logic determines a voltage threshold for a future switching cycle based on the heavy load condition. For example, the slope determination logic 444 can determine $|V_{TH2,n+1}|$ as described above in Equation (7). In such examples, the future switching cycle can be the subsequent or immediately preceding switching cycle or a different upcoming switching cycle.

At block 1508, the SR control logic 216 determines whether a load condition of the power converter is representative of a light load. For example, the slope determination logic 444 can determine that the load condition is a light load based on the slope. If, at block 1508, the SR control logic 216 determines that the load condition of the power converter is not representative of a light load, the example process 1500 concludes. For example, control can return to block 1318 of the example process 1300 of FIG. 13 or to block 1418 of the example process of FIG. 14.

If, at block 1508, the SR control logic 216 determines that the load condition of the power converter is representative of a light load, then, at block 1510, the SR control logic 216 determines a voltage threshold for a future switching cycle based on the light load condition. For example, the slope determination logic 444 can determine $|V_{TH2,n+1}|$ as described above in Equation (8). In such examples, the future switching cycle can be the subsequent or immediately preceding switching cycle or a different upcoming switching cycle. Responsive to determining the voltage threshold for the future switching cycle based on the light load condition at block 1510, the example process 1500 concludes. For example, control can return to block 1318 of the example process 1300 of FIG. 13 or to block 1418 of the example process of FIG. 14.

Example methods, apparatus, and articles of manufacture for predictive SR sensing and control with a Rogowski coil are described herein. The example methods, apparatus, and articles of manufacture described herein produce no additional loss caused by SR sensing either on the SR sensing circuit or the SR because the Rogowski coil utilizes magnetic flux for current sensing.

The example methods, apparatus, and articles of manufacture described herein have relatively high bandwidth because Rogowski coils have air-cores and, thus, the bandwidth can be very high. The example methods, apparatus, and articles of manufacture described herein do not have an SR voltage limitation as the described SR sensing techniques described herein are not limited by SR voltage stress.

Advantageously, the example methods, apparatus, and articles of manufacture described herein can be implemented in relatively high-voltage output applications (e.g., greater than 200 V, 300 V, 500 V, etc.).

The example methods, apparatus, and articles of manufacture described herein can facilitate a programmable phase difference for SR conduction optimization because the phase difference can be controlled by integrator logic described herein, and the phase difference between the SR current and sensed current can be adjusted accordingly. Advantageously, the example methods, apparatus, and articles of manufacture described herein can adjust the sensed current waveform to lead the SR current to allow response time and propagation delay while achieving optimized and/or otherwise improved SR conduction. The example methods, apparatus, and articles of manufacture described herein include control circuitry with a tunable integrator based on a priori information of the frequency being sensed and slope detection logic to determine reference voltage adjustments.

Example 1 includes an apparatus comprising an air core toroid having a voltage output, the air core toroid adapted to surround a portion of a current path and adapted to be coupled through the current path to a transformer, and a control logic circuit having a voltage input and a control output, the voltage input coupled to the voltage output, and the control output adapted to be coupled to a switch.

Example 2 includes the apparatus of example 1, wherein the air core toroid is a Rogowski coil, and the control logic circuit includes an integrator circuit coupled to the voltage output, a gain amplifier circuit coupled to the integrator circuit, a slope detection logic circuit coupled to the gain amplifier circuit, and a switch control logic circuit coupled to the integrator circuit, the gain amplifier circuit, the slope detection logic circuit, and adapted to be coupled to the switch.

Example 3 includes the apparatus of example 2, wherein the integrator circuit has a first input, a second input, a first output, and a second output, the first input and the second input coupled to the voltage output, and the gain amplifier circuit has a third input and a fourth input, the third input coupled to the first input and the fourth input coupled to the second input.

Example 4 includes the apparatus of example 2, wherein the gain amplifier circuit has a first output and a second output, the switch control logic circuit has a first input, a second input, a third input, a third output, a fourth output, and a fifth output, the first input coupled to the first output, the second input coupled to the second output, the third output coupled to the integrator circuit, the fourth output adapted to be coupled to a gate terminal of the switch, and the slope detection logic circuit has a fourth input, a fifth input, a sixth input, and a sixth output, the fourth input coupled to the first output, the fifth input coupled to the second output, the sixth input coupled to the fifth output.

Example 5 includes the apparatus of example 1, wherein the voltage output has a first terminal and a second terminal, and the control logic circuit includes an integrator circuit coupled to the first terminal and the second terminal, a gain amplifier circuit coupled to the integrator circuit and the first terminal, a switch control logic circuit coupled to the first terminal and the gain amplifier circuit, and a blanking logic circuit coupled to the switch control logic circuit.

Example 6 includes the apparatus of example 5, wherein the integrator circuit includes a first resistor having a third terminal and a fourth terminal, the third terminal coupled to the second terminal, and a capacitor having a fifth terminal and a sixth terminal, the fifth terminal coupled to the fourth terminal, the sixth terminal coupled to the first terminal, and the gain amplifier circuit includes a second resistor having a seventh terminal and an eighth terminal, the seventh terminal coupled to the fourth terminal and the fifth terminal, a third resistor having a ninth terminal and a tenth terminal, the ninth terminal coupled to the eighth terminal, and an operational amplifier having a first input, a second input, and an output, the first input coupled to the eighth terminal and the ninth terminal, the second input coupled to the first terminal, the sixth terminal, and the switch control logic circuit, the output coupled to the switch control logic circuit.

Example 7 includes the apparatus of example 5, wherein the switch control logic circuit includes a first comparator having a first input, a second input, and a first output, the first input coupled to the gain amplifier circuit, the second input coupled to the first terminal and the gain amplifier circuit, a second comparator having a third input, a fourth input, and a second output, the third input coupled to the first terminal and the gain amplifier circuit, the fourth input coupled to the gain amplifier circuit, a first latch having a fifth input, a sixth input, and a third output, the fifth input coupled to the blanking logic circuit, the sixth input coupled to the first output, and a second latch having a seventh input, an eighth input, and a fourth output, the seventh input coupled to the blanking logic circuit, the eighth input coupled to the second output, and a pulse-width modulation logic circuit having a ninth input and a tenth input, the ninth input coupled to the third output, the tenth input coupled to the fourth output.

Example 8 includes the apparatus of example 5, wherein the switch control logic circuit includes a slope detection logic circuit including a first comparator having a first input, a second input, and a first output, the first input coupled to the gain amplifier circuit, a second comparator having a third input, a fourth input, and a second output, the third input coupled to the gain amplifier circuit, a first latch having a fifth input, a sixth input, and a third output, the fifth input coupled to the blanking logic circuit, the sixth input coupled to the first output, and a second latch having a seventh input, an eighth input, and a fourth output, the seventh input coupled to the blanking logic circuit, the eighth input coupled to the second output, a first inverter having a fifth output, a second inverter having a sixth output, a first logic gate having a ninth input, a tenth input, and a seventh output, the ninth input coupled to the fifth output, the tenth input coupled to the third output, a second logic gate having an eleventh input, a twelfth input, and an eighth output, the eleventh input coupled to the sixth output, the twelfth input coupled to the fourth output, a first counter having a thirteenth input and a ninth output, the thirteenth input coupled to the seventh output, a second counter having a fourteenth input and a tenth output, the fourteenth input coupled to the eighth output, and a slope determination logic circuit having a fifteenth input, a sixteenth input, an eleventh output, and a twelfth output, the fifteenth input coupled to the ninth output, the sixteenth input coupled to the tenth output, the eleventh output coupled to the second input, the twelfth output coupled to the fourth input.

Example 9 includes a power converter comprising a transformer having a first winding and a second winding, a current path coupled to the second winding, a network including first and second switches, the first and second switches coupled to the second winding, a Rogowski coil having a voltage output, the Rogowski coil around a portion of the current path, and a control logic circuit having a voltage input and a control output, the voltage input coupled to the voltage output, the control output coupled to the first and second switches.

Example 10 includes the power converter of example 9, wherein the control logic circuit is configured to provide a respective first and second control signals to the first and second switches.

Example 11 includes the power converter of example 9, wherein the control logic circuit is configured to control the first and second switches based on the voltage output.

Example 12 includes the power converter of example 11, wherein the voltage output is induced in the Rogowski coil responsive to a current in the current path.

Example 13 includes the power converter of example 11, wherein the control logic circuit includes an integrator circuit configured to receive the voltage output and to provide an integrator output voltage having a first phase that is different from a second phase of the voltage output.

Example 14 includes the power converter of example 13, wherein the control logic circuit includes a gain amplifier circuit coupled to the integrator circuit, the gain amplifier circuit configured to generate an amplified integrated output voltage by amplifying the integrator output voltage, and slope detection logic circuit coupled to the gain amplifier circuit, the slope detection logic circuit configured to determine a difference between first and second counter values, the first counter value indicating a first time at which the amplified integrated output voltage satisfies a first threshold, the second counter value indicating a second time at which the amplified integrated output voltage satisfies a second threshold, the first threshold different from the second threshold.

Example 15 includes the power converter of example 14, wherein the control logic circuit includes a switch control logic circuit coupled to the integrator circuit, the gain amplifier circuit, and the slope detection logic circuit, the switch control logic circuit configured to control one or more of the first and second switches based on the difference.

Example 16 includes the power converter of example 13, wherein the control logic circuit is configured to determine a difference between first and second counter values, the first counter value indicating a first time at which the amplified integrated output voltage satisfies a first threshold, the second counter value indicating a second time at which the amplified integrated output voltage satisfies a second threshold, the first threshold different from the second threshold, and control one or more of the first and second switches at a third time based on the difference, the first counter value less than the second counter value, the second counter value indicating a time prior to current of the current path satisfying a zero-current threshold.

Example 17 includes a method comprising determining a first counter value responsive to a first voltage satisfying a first threshold, the first voltage based on a first output voltage sensed by a Rogowski coil arranged around a current path of a power converter, determining a second counter value responsive to a second voltage satisfying a second threshold, the second voltage based on a second output voltage sensed by the Rogowski coil, and controlling a switch of the power converter based on a difference between the first counter value and the second counter value.

Example 18 includes the method of example 17, further comprising determining a load condition associated with the power converter based on current delivered to a load, and determining at least one of the first threshold or the second threshold based on the load condition.

Example 19 includes the method of example 18, wherein the second threshold has a first value responsive to determining that the load condition is a first load condition and a second value responsive to determining that the load condition is a second load condition, the second value different from the first value.

Example 20 includes the method of example 17, further comprising determining a third threshold based on the first threshold, the second threshold, and the difference, and controlling the switch based on the first threshold and the third threshold.

Example 21 includes the method of example 17, wherein the second voltage satisfies the second threshold at a first time prior to the second output voltage satisfying a zero crossing threshold at a second time after the first time.

Modifications are possible in the described embodiments, and other embodiments are possible, within the scope of the claims.

What is claimed is:
1. An apparatus comprising:
a Rogowski coil having a voltage output; and
a control circuit including:
an integrator circuit having a voltage input and an integrator output, the voltage input coupled to the voltage output;
a gain amplifier circuit having an integrator input and an amplifier output, the integrator input coupled to the integrator output;
a slope detection circuit having a first amplifier input and a detection output, the first amplifier input coupled to the amplifier output; and
a switch control circuit having a second amplifier input, a detection input and a switch control output, the second amplifier input coupled to the amplifier output, and the detection input coupled to the detection output.

2. The apparatus of claim 1, wherein:
the voltage output includes first and second voltage outputs;
the voltage input includes first and second voltage inputs respectively coupled to the first and second voltage outputs;
the integrator output includes first and second integrator outputs; and
the integrator input includes first and second integrator inputs respectively coupled to the first and second integrator outputs.

3. The apparatus of claim 1, wherein:
the amplifier output includes first and second amplifier outputs;
the first amplifier input includes third and fourth amplifier inputs respectively coupled to the first and second amplifier outputs;
the second amplifier input includes fifth and sixth amplifier inputs respectively coupled to the first and second amplifier outputs; and
the switch control circuit includes a blanking circuit having a blanking output, and the slope detection circuit has a blanking input coupled to the blanking output.

4. An apparatus comprising:
an air core toroid having first and second voltage outputs; and
a control circuit including:
an integrator circuit having an integrator output and first and second voltage inputs, the first and second voltage inputs respectively coupled to the first and second voltage outputs;

a gain amplifier circuit having an integrator input and an amplifier output, the integrator input coupled to the integrator output; and a switch control circuit having an amplifier input and a switch control output, the amplifier input coupled to the amplifier output, in which the switch control circuit includes a blanking circuit having a blanking output.

5. The apparatus of claim 4, wherein:

the integrator circuit includes a capacitor and a first resistor, in which the capacitor is coupled between the first voltage output and the first resistor, and the first resistor is coupled between the second voltage output and the capacitor; and the gain amplifier circuit includes:

an operational amplifier having an operational amplifier output and first and second operational amplifier inputs, in which the first operational amplifier input is coupled to the first voltage output, and the operational amplifier output is coupled to the amplifier output;

a second resistor coupled between the first resistor and the second operational amplifier input; and a third resistor coupled between the second resistor and the operational amplifier output.

6. The apparatus of claim 4, wherein the blanking output includes first and second blanking outputs, and the switch control circuit includes:

a first comparator having a first comparator output and first and second comparator inputs, the first comparator input coupled to the amplifier output;

a second comparator having a second comparator output and third and fourth comparator inputs, the fourth comparator input coupled to the amplifier output;

a first latch having a first latch output and first and second latch inputs, the first latch input coupled to the first comparator output, and the second latch input coupled to the first blanking output;

a second latch having a second latch output and third and fourth latch inputs, the third latch input coupled to the second comparator output, and the fourth latch input coupled to the second blanking output; and a pulse-width modulation (PWM) circuit having PWM outputs and first and second PWM inputs, the first PWM input coupled to the first latch output, the second PWM input coupled to the second latch output, and the PWM outputs coupled to the switch control output.

7. The apparatus of claim 4, wherein the blanking output includes first and second blanking outputs, the control circuit includes a slope detection circuit, and the slope detection circuit includes:

a first comparator having a first comparator output and first and second comparator inputs, the first comparator input coupled to the amplifier output;

a second comparator having a second comparator output and third and fourth comparator inputs, the fourth comparator input coupled to the amplifier output;

a first latch having a first latch output and first and second latch inputs, the first latch input coupled to the first comparator output, and the second latch input coupled to the first blanking output;

a second latch having a second latch output and third and fourth latch inputs, the third latch input coupled to the second comparator output, and the fourth latch input coupled to the second blanking output a first logic gate having a first logic gate output and first and second logic gate inputs, the first logic gate input coupled to the first latch output;

a second logic gate having a second logic gate output and third and fourth logic gate inputs, the third logic gate input coupled to the second latch output;

a first inverter having a first inverter output coupled to the second logic gate input;

a second inverter having a second inverter output coupled to the fourth logic gate input;

a first counter having a first counter input and a first counter output, the first counter input coupled to the first logic gate output;

a second counter having a second counter input and a second counter output, the second counter input coupled to the second logic gate output; and a slope determination circuit having first and second slope determination inputs and first and second slope determination outputs, the first slope determination input coupled to the first counter output, the second slope determination input coupled to the second counter output, the first slope determination output coupled to the second comparator input, and the second slope determination output coupled to the third comparator input.

8. A power converter comprising:

a transformer having a first winding and a second winding;

a current path coupled to the second winding;

a network including first and second switches, the first and second switches coupled to the second winding;

a Rogowski coil having a voltage output, the Rogowski coil around a portion of the current path; and a control circuit having a voltage input and a control output, the voltage input coupled to the voltage output, and the control output coupled to the first and second switches, in which the control circuit is configured to control the first and second switches based on the voltage input, and the control circuit includes an integrator circuit configured to provide an integrator output voltage having a first phase different from a second phase of the voltage input.

9. The power converter of claim 8, wherein the control output includes first and second control outputs respectively coupled to the first and second switches, and the control circuit is configured to provide respective first and second control signals at the first and second control outputs.

10. The power converter of claim 8, wherein the voltage output is induced in the Rogowski coil responsive to a current in the current path.

11. The power converter of claim 8, wherein the control circuit includes:

a gain amplifier circuit coupled to the integrator circuit, the gain amplifier circuit configured to generate an amplified integrated output voltage by amplifying the integrator output voltage; and a slope detection circuit coupled to the gain amplifier circuit, the slope detection circuit configured to determine a difference between first and second counter values, the first counter value indicating a first time at which the amplified integrated output voltage satisfies a first threshold, the second counter value indicating a second time at which the amplified integrated output voltage satisfies a second threshold different from the first threshold.

12. The power converter of claim 11, wherein the control circuit includes a switch control circuit coupled to the integrator circuit, the gain amplifier circuit and the slope detection circuit, the switch control circuit configured to control one or more of the first or second switches based on the difference.

13. The power converter of claim 8, wherein the control circuit is configured to:
  determine a difference between first and second counter values, the first counter value indicating a first time at which the amplified integrated output voltage satisfies a first threshold, the second counter value indicating a second time at which the amplified integrated output voltage satisfies a second threshold different from the first threshold; and
  control one or more of the first or second switches at a third time based on the difference, the first counter value less than the second counter value, and the second counter value indicating a time before current of the current path satisfies a zero-current threshold.

14. A method comprising:
  determining a first counter value responsive to a first voltage satisfying a first threshold, the first voltage based on a first output voltage sensed by a Rogowski coil arranged around a current path of a power converter;
  determining a second counter value responsive to a second voltage satisfying a second threshold, the second voltage based on a second output voltage sensed by the Rogowski coil; and
  controlling a switch of the power converter based on a difference between the first counter value and the second counter value.

15. The method of claim 14, further comprising:
  determining a load condition associated with the power converter based on current delivered to a load; and
  determining at least one of the first threshold or the second threshold based on the load condition.

16. The method of claim 15, wherein the second threshold has a first value responsive to determining that the load condition is a first load condition and a second value responsive to determining that the load condition is a second load condition, the second value different from the first value.

17. The method of claim 14, further comprising:
  determining a third threshold based on the first threshold, the second threshold, and the difference; and
  controlling the switch based on the first threshold and the third threshold.

18. The method of claim 14, wherein the second voltage satisfies the second threshold at a first time before the second output voltage satisfies a zero crossing threshold at a second time after the first time.

* * * * *